United States Patent [19]

Itabashi et al.

[11] Patent Number: 5,097,304
[45] Date of Patent: Mar. 17, 1992

[54] IMAGE READING DEVICE WITH VOLTAGE BIASES

[75] Inventors: Satoshi Itabashi, Atsugi; Toshihiro Saika; Ihachiro Gofuku, both of Hiratsuka, all of Japan

[73] Assignee: Canon Kabushiki Kaisha, Tokyo, Japan

[21] Appl. No.: 613,449

[22] Filed: Nov. 14, 1990

Related U.S. Application Data

[63] Continuation of Ser. No. 541,088, Jun. 19, 1990, abandoned, which is a continuation of Ser. No. 470,999, Jan. 26, 1990, abandoned, which is a continuation of Ser. No. 309,953, Feb. 9, 1989, abandoned, which is a continuation of Ser. No. 105,036, Oct. 6, 1987, abandoned.

[30] Foreign Application Priority Data

Oct. 7, 1986 [JP] Japan .................. 61-237064
Oct. 7, 1986 [JP] Japan .................. 61-237065
Oct. 7, 1986 [JP] Japan .................. 61-237067

[51] Int. Cl.$^5$ .............................................. H01L 27/14
[52] U.S. Cl. ........................................ 357/30; 357/32; 357/58; 357/2; 250/211 R; 250/211 J; 250/578.1
[58] Field of Search ............... 357/31, 32, 58, 2, 30 K, 357/30 L, 30 H, 30 D, 30 G

[56] References Cited

U.S. PATENT DOCUMENTS

| | | | |
|---|---|---|---|
| 4,291,326 | 9/1981 | Higuchi et al. | 357/30 L X |
| 4,405,915 | 9/1983 | Komatsu et al. | 357/30 K X |
| 4,621,275 | 11/1986 | Ueno et al. | 357/30 L |
| 4,650,984 | 3/1987 | Furushima et al. | 250/211 R |
| 4,672,221 | 6/1987 | Saito et al. | 357/30 L X |
| 4,916,304 | 4/1990 | Itabashi et al. | 250/211 R |

FOREIGN PATENT DOCUMENTS

| | | | |
|---|---|---|---|
| 0232083 | 8/1987 | European Pat. Off. | |
| 3705173 | 9/1987 | Fed. Rep. of Germany | 357/30 L X |
| 55-74262 | 6/1980 | Japan . | |
| 55-75271 | 6/1980 | Japan . | |
| 56-45084 | 4/1981 | Japan . | |
| 56-112172 | 9/1981 | Japan . | |
| 59-122274 | 7/1984 | Japan | 357/30 L X |
| 60-115259 | 6/1985 | Japan . | |
| 60-239072 | 11/1985 | Japan . | |
| 61-84860 | 4/1986 | Japan | 357/30 L X |

*Primary Examiner*—William Mintel
*Attorney, Agent, or Firm*—Fitzpatrick, Cella, Harper & Scinto

[57] ABSTRACT

An image reading device has photo-sensor units arranged in the form of an array constituting a line sensor. Each sensor unit includes a light-shielding layer formed on a light-transmitting substrate, an insulating layer formed on the light-shielding layer, a semiconductor layer disposed on the insulating layer, and a pair of upper electrodes provided on the semiconductor layer and spaced from each other. The space between the upper electrodes constitutes a light-receiving window through which the semiconductor layer receives light applied from the reverse side of the substrate onto the surface of an image-carrying original and reflected by the original. Thus, the semiconductor layer produces an electric signal representing the read image. The light-shielding layer is made of an electrically conductive material such as a metal. A voltage application circuit is provided for applying to the light-shielding electrode a voltage of a level which is lower than the levels of voltages applied to the pair of upper electrodes. The level of the voltage may be varied along the length of the array of the photo-sensor units.

17 Claims, 14 Drawing Sheets

IMAGE READING DEVICE WITH VOLTAGE BIASES

This application is a continuation of application Ser. No. 541,088 filed June 19, 1990, now abandoned, which is a continuation of application Ser. No. 470,999 filed Jan. 26, 1990, now abandoned, which is a continuation of application Ser. No. 309,953 filed Feb. 9, 1989, now abandoned, which is a continuation of application Ser. No. 105,036 filed Oct. 6, 1987, now abandoned.

BACKGROUND OF THE INVENTION

1. Field of the Invention

The present invention relates to an image reading device of the type having a one-dimensional image sensor such as a line sensor adapted to read an image on an image carrier such as an original document which is moved relatively to the line sensor in close contact therewith. The image reading device of the invention is suitable for use in, for example, facsimiles, copiers and image readers.

2. Related Background Art

An image reading device has been known in which successive line images on an original are focused through a contacting optical system on a one-dimensional line sensor having a length of several centimeters in the direction of the main scan, thereby enabling the line sensor to read the image carried by the original. This image reading device essentially requires a contacting optical system which has an optical path of a large length. In addition, the contacting optical system itself has a considerably large size. For these reasons, it has been difficult to obtain a compact design of the image reading device of the type mentioned above.

In another type of known image reading device, the line image is focused through a real-size optical system on an elongated line sensor having a length substantially equal to the length of the original as measured in the direction of the main scan. It is rather easy for this type of image reading device to have a reduced size, because the size of the space accommodating the optical system is much smaller than that in the first-mentioned type of the image reading device. The real-size optical system can be constituted by, for example, converging optical fibers or a contact lens array.

The converging optical fibers and the contact lens array, however, are generally expensive so that the cost of the image reading device is raised undesirably.

Under these circumstances, the present applicant has proposed a contact-type image reading method in which an original carrying the image to be read is moved relative to a one-dimensional line sensor in direct contact therewith. This method is disclosed, for example, in Japanese Patent Application Laid-Open Publication Nos. 74262/1980, 45084/1981 and 122172/1981.

FIG. 1 is a schematic fragmentary sectional view of an essential portion of the contact-type image reading device. The device has a sensor 8 constituted by a one-dimensional line sensor which is arranged on a transparent substrate 11 so as a sheet of glass such as to extend in the direction perpendicular to the plane of the drawing.

The sensor 8 has a multi-layer structure constituted by a light-shielding layer 12 made of a light-shielding material such as a metal and placed on the transparent substrate 11, an insulating layer 13 made of an electrically insulating material and laid on the light-shielding layer 12, and a photoconductive semiconductor layer 14 formed on the insulating layer 13 and made of a photoconductive semiconductor material such as hydrogenerated amorphous silicon (referred to as "a- -Si : H", hereinunder) and CDs.Se. A pair of main electrodes 16 and 17 are formed on the semiconductor layer 14 through an intermediary of a semiconductor layer 15 which is made of a semiconductor material doped with a semiconductor impurity for the purpose of attaining an ohmic contact. The area between the pair of main electrodes 16 and 17 constitutes a light-receiving window 18.

In operation, a light L from a light source 30 enters through a window 19 formed in the transparent substrate 11 so as to illuminate an original P and is reflected by the image. The reflected light then impinges upon the window 18 of the sensor 8 thereby to produce a photoelectric current which flows between the main electrodes 16 and 17 through the semiconductor layer 14. This photoelectric current is detected as the reading signal.

According to this arrangement, the light from the light source 30 enters from the reverse side of the substrate 11. If the sensor 8 lacks the light-shielding layer 12, a portion of the light emitted from the light source will directly reach the sensor 8 in addition to the light reflected by the image. The light directly reaching the sensor 8 will produce a steady photo-electric current so as to generate a large amount of noise, resulting in an impractically low S/N ratio which is in this case the ratio between the signal photoelectric current produced by the reflected light and the noise produced mainly by the steady current. It is therefore essential that the sensor 8 has a light-shielding layer 12. In order to shield the light which would directly reach the sensor 8 without fail, the light-shielding layer 12 is required to have a sufficiently large light-shielding power. In addition, the light-shielding layer 12 preferably has a small thickness. To comply with these demands, the light-shielding layer is made of a metal or a similar material.

A reading resolution on the order of 4 to 8 lines/mm is obtainable when a clearance of about 0.1 mm is maintained between the original P and the sensor 8. In order to maintain the required resolution, the clearance between the original P and the sensor 8 has to be controlled precisely. Such a precise control of the clearance can be attained by, for example, forming a transparent protective layer 20 on the upper side of the sensor 8.

In general, the sensor of an image reading device is required to meet various demands such as reduced dark current, large S/N ratio and high linearity of the output current $I_p$ in relation to the incident light.

As explained before, the contact-type image reading device essentially requires a light-shielding layer 12. Hitherto, however, no specific consideration has been given to the potential of the light-shielding layer 12. In consequence, the light-shielding layer electrically floats and is held in an unstable state. This in turn makes the band state of the semiconductor layer 14 contacting the insulating layer 13 on the light-shielding layer 12 unstable, resulting in an unstable photoelectric current as the output.

The semiconductor layer 14, when formed from a-Si: $H$ has $n^-$ conduction type so that the flat band voltage is slightly negative, as will be understood from a C-V curve which will be mentioned later. Therefore, a weak accumulation is caused at the boundary between the light-shielding layer 12 and the insulating layer 13. This inconveniently increases the level of the dark current resulting in a degradation of the quality of the reading output.

It is therefore strongly desired to eliminate the above-described problems encountered by the known image reading device.

SUMMARY OF THE INVENTION

Accordingly, an object of the present invention is to provide an image reading device which is capable of stably reading an image with a good quality of reading output, thereby overcoming the above-described problems of the prior art.

To this end, according to one aspect of the invention, there is provided an image reading device having photosensor units each including a light-shielding layer formed on a light-transmitting substrate, an insulating layer formed on the light-shielding layer, a semiconductor layer disposed on the insulating layer, and a pair of upper electrodes provided on the semiconductor layer and spaced from each other. The space between the upper electrodes constitutes a light-receiving window through which the semiconductor layer receives light applied from the reverse side of the substrate onto the surface of an image-carrying original and reflected by the original. Thus, the semiconductor layer produces an electric signal representing the read image. The image reading device comprises: an electrically conductive layer constituting the light-shielding layer; and voltage application means for applying to the light-shielding electrode a voltage of a level which is lower than the levels of voltages applied to the pair of upper electrodes.

According to another aspect of the invention, there is provided an image reading device having a plurality of photo-sensors arrayed on a substrate and each including an electrically conductive layer, an insulating layer formed on the conductive layer, a semiconductor layer disposed on the insulating layer and a pair of main electrodes provided in contact with the semiconductor layer and spaced from each other. Bias voltage application means are provided for applying a bias voltage to the conductive layer, the level of the bias voltage being varied in the array direction of the photo-sensor units.

According to still another aspect of the invention, there is provided an image reading device having photo-sensor units each including a light-shielding layer formed on a light-transmitting substrate, an insulating layer formed on the light-shielding layer, a semiconductor layer disposed on the insulating layer, and a pair of upper electrodes provided on the semiconductor layer and spaced from each other, the space between the upper electrodes constitutes a light-receiving window through which the semiconductor layer receives light applied from the reverse side of the substrate onto the surface of an image-carrying original and reflected by the original. Thus, the semiconductor layer produces an electric signal representing the read image. The image reading device comprises: an electrically conductive layer constituting the light-shielding layer; and voltage application means adapted to apply to the light-shielding layer a bias voltage of a level determined in accordance with the polarity of the carrier carrying the photoelectric current generated in the semiconductor layer and also with the quantity of the charges of the carrier. The voltage application means are further adapted to apply, in the non-reading period of the reading operation, a voltage $V_a$ having the same polarity as the bias voltage and an absolute value smaller than that of the bias voltage.

DESCRIPTION OF THE PREFERRED EMBODIMENTS

Preferred embodiments of the present invention will be described hereinunder with reference to the accompanying drawings.

Figure 1:
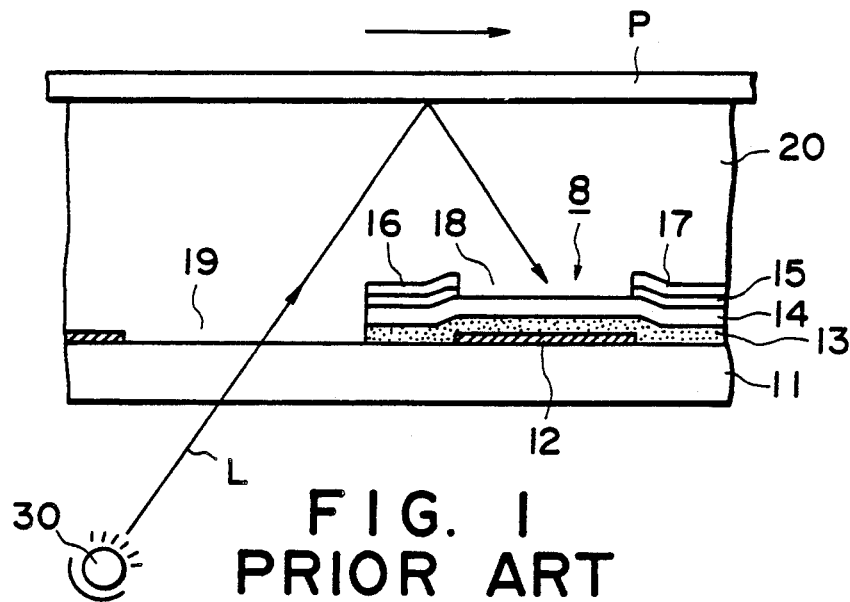
FIG. 1 is a schematic fragmentary sectional view of an essential portion of a known image reading device.
Figure 2A:
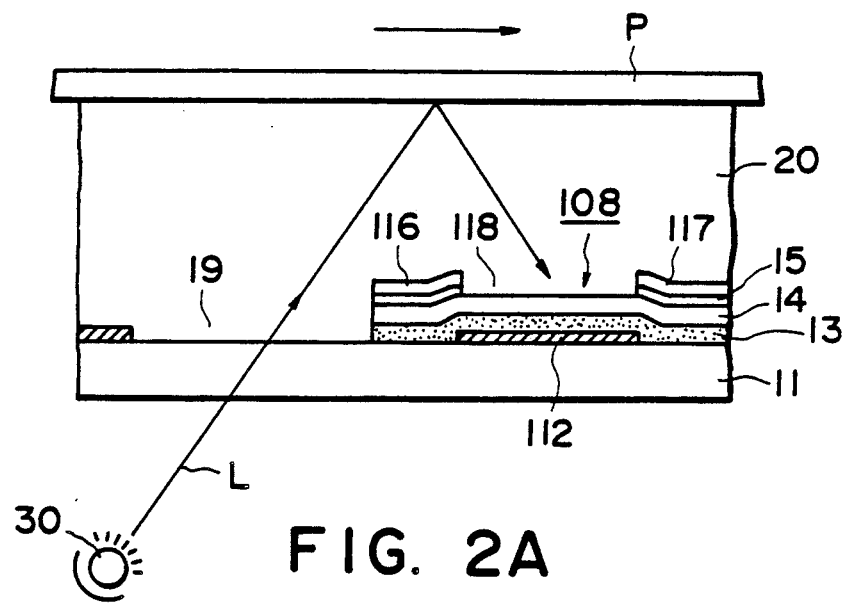
FIG. 2A is a schematic fragmentary sectional view of an essential portion of a first embodiment of the image reading device in accordance with the present invention.
Figure 2B:
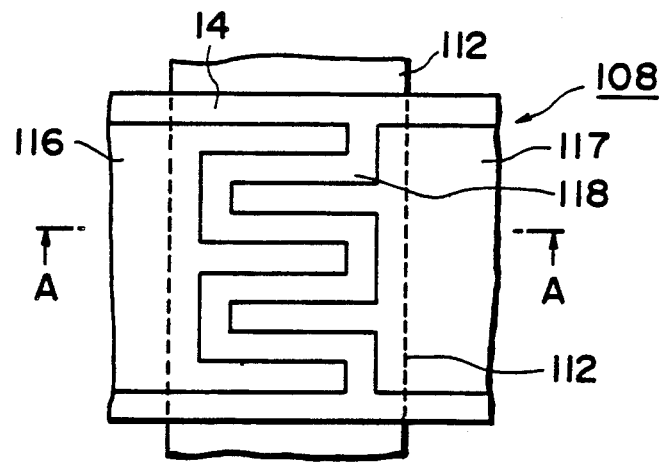
FIG. 2B is a schematic plan view of an essential portion of the first embodiment as shown in FIG. 2A.

FIG. 2A is a schematic sectional view of an essential portion of a first embodiment of the image reading device in accordance with the present invention, taken along the A—A in FIG. 2B which is a plan view of a sensor unit of the first embodiment. In these Figures, the same reference numerals are used to denote the same parts or members as those appearing in FIG. 9.

The first embodiment of the image reading device in accordance with the present invention has a sensor unit 108 which includes a light-shielding layer 112 made of an electrically conductive material such as a metal and is connected to a later-mentioned electrical driving system in such a manner as to constitute a gate electrode which cooperates with a pair of main electrodes 116 (source electrode) 117 (drain electrode). The main electrodes 116 and 117 have comb-like forms such as to mate with each other thereby forming a zig-zag light-receiving window 118 therebetween as shown in FIG. 2B. The light reflected by the original P is received by the portion of the semiconductor layer 14 exposed through the window 118, so as to be converted into photoelectric current.

The sensor unit 108 shown in FIGS. 2A and 2B corresponds to one bit (cell) of the image reading device. It is possible to form a one-dimensional line sensor by arraying a plurality of such sensor units 108 on a substrate 11. For instance, by arraying 1728 pieces of the such sensor unit 108 in the direction of width of the original P, i.e., in the direction perpendicular to the original feeding direction indicated by an arrow in FIG. 2A, it is possible to obtain a reading resolution of 8 lines/mm over a width (216 mm) of A-4 size paper. The image reading device further has charge accumulating units (capacitor units) for accumulating the outputs from the photo-sensor units, switch units for transferring the accumulated charges for the purpose of signal processing, and necessary wiring patterns. These units may be formed on the substrate in a single production process.

Figure 3A:
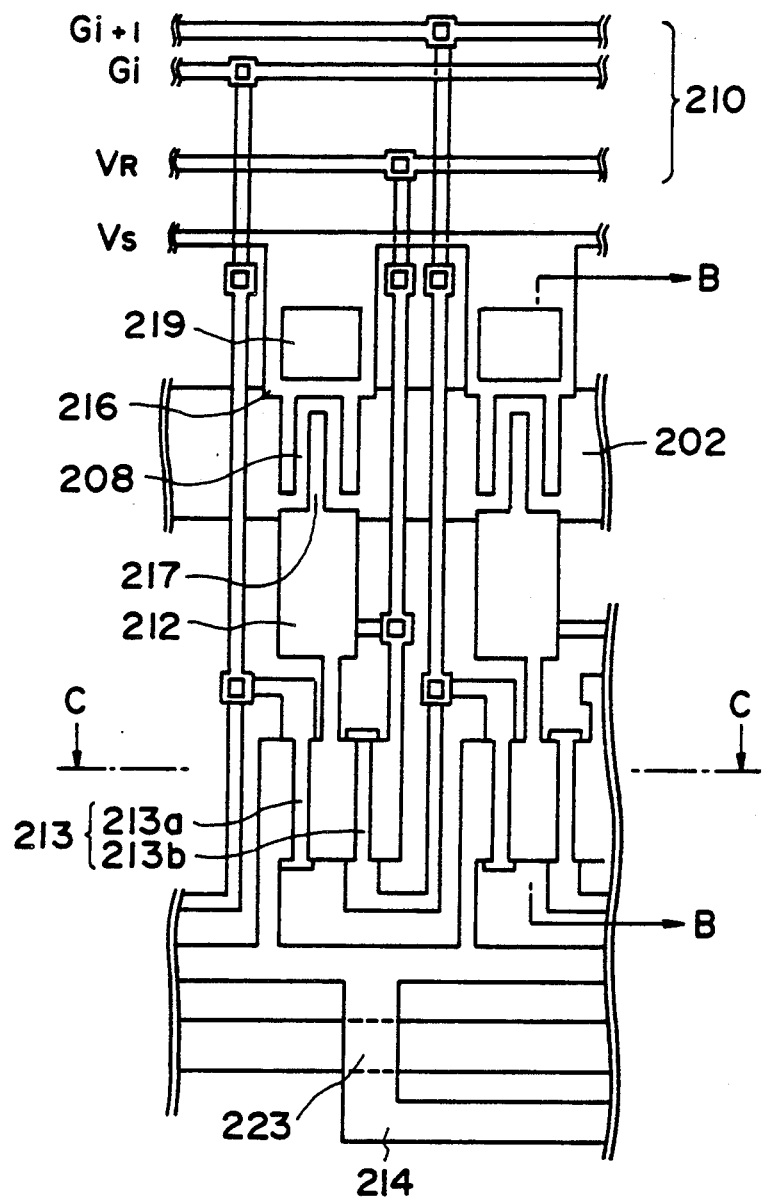
FIG. 3A is a schematic plan view of a second embodiment of the image reading device in accordance with the present invention.
Figure 3B:
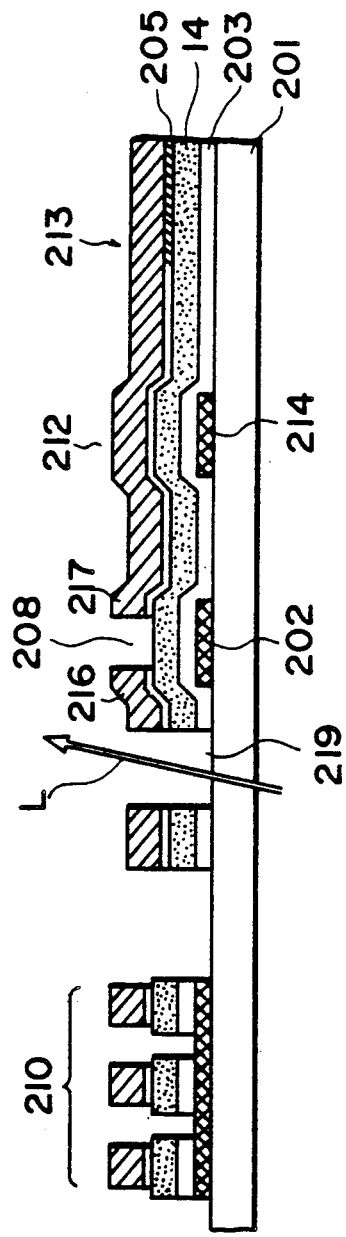
FIG. 3B is a sectional view taken along the line B—B of FIG. 3A.

FIG. 3A is a plan view of a second embodiment in which the photo-sensor units, charge accumulating units and switch units are formed integrally. FIGS. 3B and 2C are sectional views taken along the lines B—B and C—C of FIG. 3A, respectively.

This embodiment of the image reading device has a plurality of units each having a gate matrix wiring portion 210, a photo-sensor unit 208, a charge accumulating unit 212, a switch unit 213 including a transfer switch 213a and a discharge switch 213b for resetting the charge accumulating unit 212, wiring for transferring the output from the transfer switch 213a to a later-mentioned signal processing unit, and a load capacitor 223 for accumulating and reading the charges transferred through the transfer switch 213a.

In this embodiment, the photoconductive semiconductor layer 14 commonly used for the photo-sensor unit 208, transfer switch 213a and the discharge switch 213b is made of an a-Si:H film, while an insulating layer 203 is constituted by silicon nitride layer (SiNH) formed by a glow discharge.

FIG. 3A shows only the upper and lower electrode wiring layers. Namely, the photoconductive semiconductor layer 14 and the insulating layer 203 are omitted for the purpose of clarification of the drawing. The photoconductive semiconductor layer 14 and the insulating layer 203 are commonly used for the photo-sensor unit 208, charge accumulating unit 212, transfer switch 213a and the discharge switch 213b. These layers 14 and 203 also have portions placed between the upper electrode wiring and the substrate. In order to attain an ohmic contact, an a-Si:H layer doped in n+ type is disposed between the upper electrode wiring and the photoconductive semiconductor layer.

The wiring pattern in the line sensor used in this embodiment is such that the output signal lines from the sensor units do not intersect or cross other lines so as to eliminate any cross-talk between signal components and induction noise which may otherwise be caused by the gate electrode wiring.

The photo-sensor unit 208 has upper electrode wirings 216 and 217. The light entering through the incidence window 219 is reflected by the original surface and impinges upon the photoconductive semiconductor layer 14 so as to cause a change in the electric current flowing between the comb-shaped opposing upper electrode wirings 216 and 217. A reference numeral 202 denotes a light-shielding layer made of an electrically conductive and light-shielding material such as a metal and connected to a later-mentioned electric driving unit.

The charge accumulating unit 212 is composed of a lower electrode wiring 214, a dielectric portion constituted by an insulating layer 203 formed on the lower electrode wiring 214 and the photoconductive semiconductor layer 14, and electric wiring which is an extension of the upper electrode wiring 217 of the photo-sensor unit and laid on the photoconductive semiconductor layer 14. The charge accumulating unit 212 has a construction which is the same as that known as an MIS (Metal-Insulating-Semiconductor) capacitor. The charge accumulating unit can operate either with a positive or a negative bias. It is, however, to be noted that stable capacitance and frequency characteristics are obtained by negatively biasing the lower electrode wiring 214.

Figure 3C:
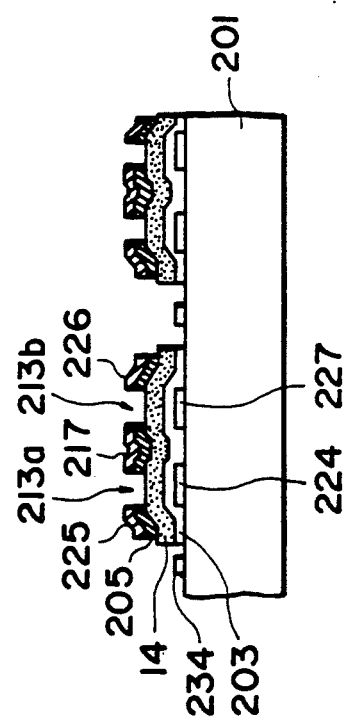
FIG. 3C is a sectional view taken along the line C—C of FIG. 3A.

FIG. 3C shows the switch unit 213 which has the transfer switch 213a and the discharge switch 213b and is constructed as a thin-film-type transistor (TFT). The transfer switch 213a is constituted by lower electrode wiring 224 serving as a gate electrode, an insulating layer 203 serving as a gate insulating layer, a photoconductive semiconductor layer 14, an upper electrode wiring 225 serving as a source electrode, and an upper electrode wiring 217 serving as a drain electrode. The discharge switch 213b has a gate insulating layer and the photoconductive semiconductor layer which are constituted by the insulating layer 203 and the photoconductive semiconductor layer 14 mentioned before. The discharge switch also has a source electrode constituted by a lower electrode wiring 227, gate electrode constituted by the lower electrode wiring 227 and a drain electrode constituted by the upper electrode wiring 226. A reference numeral 234 denotes lower wiring connected to the gate electrode of a transfer switch 213a.

As has been described, the n+ type a-Si:H layer 205 is provided between the upper electrode wirings 217, 225 and 226 and the photoconductive semiconductor layer 14, so as to provide the ohmic contact.

The line sensor having the described construction can be produced by a single process because all of the constituents such as the photo-sensor unit, charge accumulating unit, transfer switch, discharge switch and matrix wirings have laminated structures including layers such as the photoconductive semiconductor layer and the insulating layer.

Figure 4:
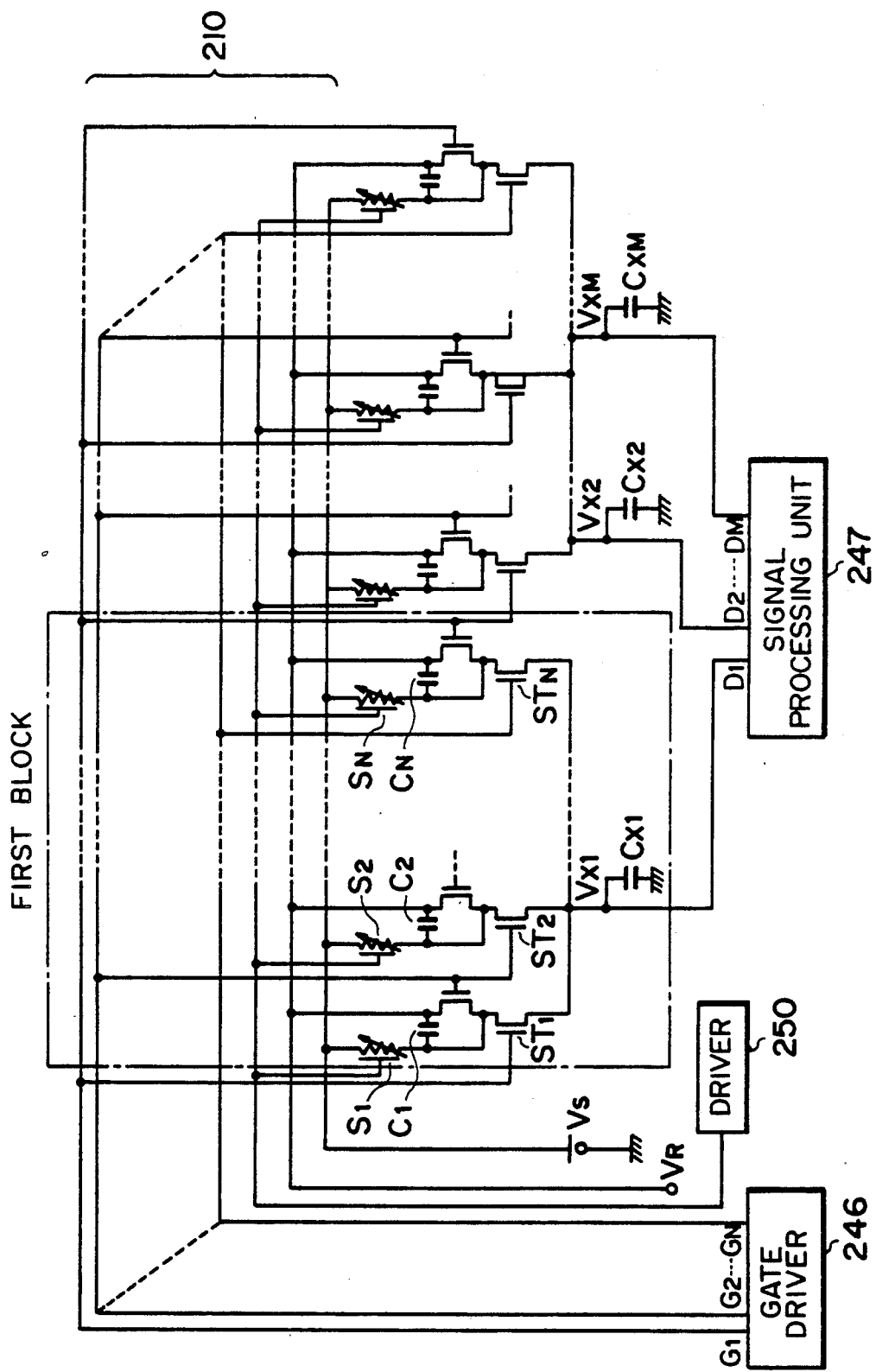
FIG. 4 is an equivalent circuit diagram of a circuit equivalent to the image reading device of the present invention.

FIG. 4 shows a circuit which is equivalent to the image reading device as shown in FIGS. 3A to 3C.

The circuit includes photo-sensor units S1, S2, ..., SN (represented by SY1, hereinafter), charge accumulating capacitors C1, C2, ..., CN (hereinafter CY1) constituting the charge accumulating units 212 adapted for accumulating the photoelectric current from the photo-sensor units SY1, transfer switch units ST1, ST2, ..., STN (hereinafter STY1) corresponding to the transfer switches 213a and adapted for transferring the charges of the accumulating capacitors CY1 to load capacitors CX1 which correspond to the load capacitors 223, and discharge switches SR1, SR2, ..., SRN (hereinafter RY1) corresponding to the discharge switches 213b and adapted for resetting the charges on the accumulating capacitors CY1.

The photo-sensor SY1, accumulating capacitors CY1, transfer switches STY1 and the discharge switches SRY1 are arrayed in respective rows. The image reading device of this embodiment is sectioned into M blocks each including N pieces of photo-sensor units SY1, N pieces of accumulating capacitors CY1, N pieces of transfer switches STY1 and N pieces of discharge switches SRY1. For instance, when a line sensor is composed of 1728 of such units, these units are divided into M blocks, e.g., 54 blocks, each containing N units, e.g., 32 units. The gate electrodes of the transfer switches STY1 and discharge switches SRY1 arranged in arrays are connected to the matrix wiring portion 210. The gate electrode of each transfer switch STY1 in each block is commonly connected to the gate electrodes of the transfer switches STY1 of the same order in other blocks. The gate electrode of each discharge switch SRY1 of each block is connected in a cyclic manner, i.e., to the gate electrode of the transfer switch SRY1 on the next order in the same block.

The common wiring (gate driving lines G1, G2, ..., GN) of the matrix wiring 210 are driven by a gate driving unit 246. On the other hand, the signal output is connected to the signal processing unit 247 through lead lines 214, i.e., signal output lines D1, D2, ..., DN.

The gate electrodes (light-shielding layers 202) of the photo-sensor units S1, ..., SN, ..., SN×M are connected to a driving source 250 and are supplied with negative bias voltage.

The gate driving lines G1, G2, ..., GN are successively supplied with selection pulses VG1, VG2, VG3, ..., VGN from the gate driving unit 246. When the gate driving line G1 is selected, the transfer switch ST1 is turned on and the charges accumulated in the charge accumulating capacitor C1 are transferred to the load capacitor CX1. Then, the next gate driving line G2 is selected so that the next transfer switch ST2 is turned on, whereby the charges accumulated in the charge accumulating capacitor C2 are transferred to the load capacitor CX2 and, at the same time, the accumulating capacitor C1 is reset by means of the discharge switch SR1. In the like manner, driving lines G3, G4, ..., GN are successively selected and a reading operation is successively conducted. This operation is conducted for each of the plurality of blocks. The outputs VX1, VX2, ..., VXM are transmitted to the input sections D1, D2, ..., DM of the signal processing unit 247 so as to be changed into a serial output signal from the signal processing unit 247.

In this embodiment, a negative bias voltage is applied to the gate electrodes of the photo-sensors S1, ..., SN, SN×M, for the following reason.

Figure 5:
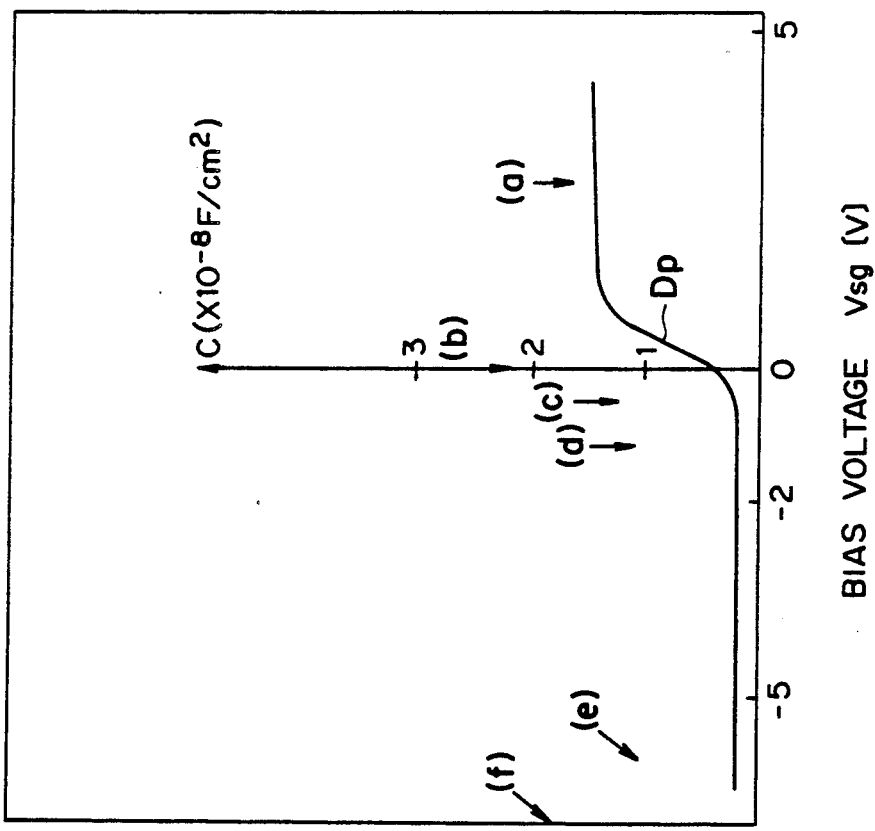
FIG. 5 is a graph showing a change in capacitance in relation to a bias voltage $V_{sg}$ in the photo-sensor of the image reading device shown in FIG. 3.

FIG. 5 illustrates a change in the capacitance formed between the light-shielding layer 112 and the upper electrodes 116, 117 as observed when the insulating layer 203 and the semiconductor layer 14 of the sensor as shown in FIG. 3A are formed from an SiNiH film of 3,000 Å and an a-Si:H film of 4,000 Å, respectively. This capacitance includes the capacitances provided by the insulating layer 203 and the semiconductor layer 14. A curve $C_p$ shows a change in the capacitance as obtained in a dark state, i.e., when there is no input light. A depletion layer formed in the semiconductor layer 14 progressively becomes greater in the thicknesswise direction as the absolute value of the negative bias voltage is increased. In consequence, the capacitance $C_p$ gradually decreases as the absolute value of the negative bias voltage $V_{sg}$ increases. From this graph, it will be seen that the depletion layer spreads over the entire thickness of the semiconductor layer 14 when the bias voltage $V_{sg}$ is $-1V$. This means that any unfavourable effect produced by the capacitance in the dark state, i.e., any influence of the dark current, can be eliminated by applying to the gate electrode a negative bias voltage which is below $-1V$ and selected to provide a certain level of capacitance when illuminated by light. It is thus possible to improve the S/N ratio by applying such a negative bias voltage.

Figure 6:
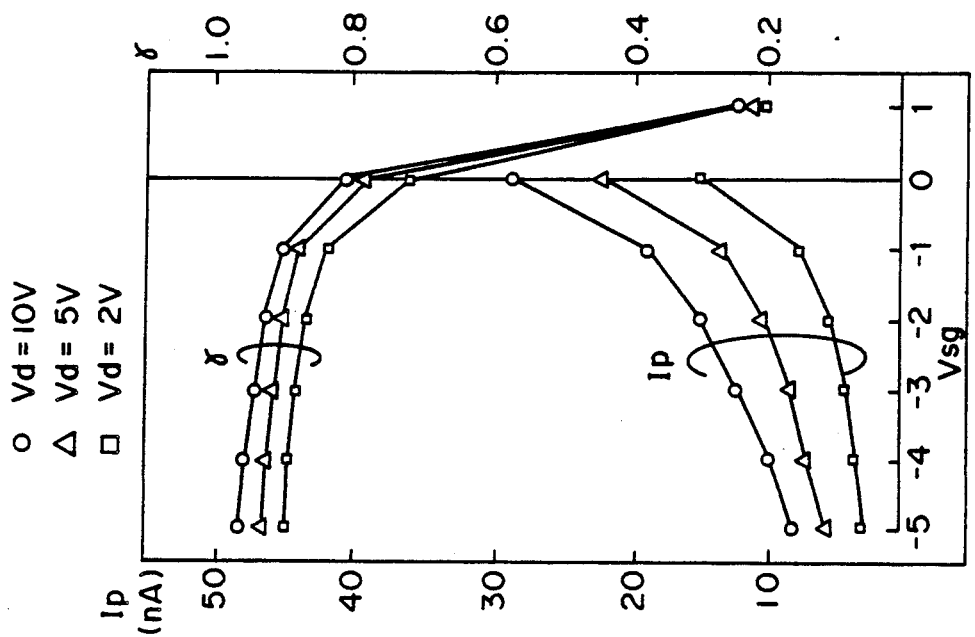
FIG. 6 is a graph showing the relationship between the actually measured values of photoelectric current $I_p$ and an $\alpha$ value in relation to the bias voltage $V_{sg}$.

FIG. 6 shows a graph illustrating the photo-electric current $I_p$ in relation to the bias voltage $V_{sg}$ and the light-quantity-dependency (linearity) of the sensor characteristics represented by $\gamma$. A condition represented by $\gamma = 1$ represents an ideal state. The characteristics as shown in FIG. 6 have been obtained through a test conducted by varying the voltage applied to the drain electrode (electrode 117 in FIG. 2A and electrode 217 in FIG. 3A) of the photo-sensor. The photo-sensor used in the experiment had an a-Si:H semiconductor layer 14 4,000 Å thick. The values of the photoelectric current $I_p$, linearity $\gamma$ and the S/N ratio were evaluated for each of the points (a) to (f) shown in FIG. 5, the results of which are shown in the following Table 1.

TABLE 1

| $V_{sg}$ | (a) | (b) (0V) | (c) | (d) (−1 V) | (e) | (f) (−10 V) |
|---|---|---|---|---|---|---|
| $I_p$ | very large | large | → | → | → | small |
| $I_d$ | very large | → | small | → | → | large |
| $\gamma$ | small | → | large | | 0.9 to 1.0 | |
| S/N | x | x | Δ | o | o | Δ |
| stability | x | x | Δ | o | o | Δ | where,
O represents excellent,
Δ represents good, and
x represents not so good.

Analysis of Table 1 above will show that the depletion layer spreads over the entire thickness of the semiconductor layer so as to reduce the dark current to a negligibly low level when the voltage $V_{sg}$ is $-1V$ and that appreciable effects in the improvements of the $\gamma$ value and the S/N ratio can be obtained by applying a bias voltage below this level to the gate electrode of the sensor. It is to be understood, however, that a bias voltage not higher than − (minus) 10V degrades the S/N ratio due to an increase in the influence of the noise and reduction in the signal level $I_p$, though the $\gamma$ value is appreciably high.

In this embodiment, therefore, the driving unit 250 is constructed as a power supply capable of varying the output voltage which is adjusted so that a bias voltage which is on the order of −1V to −10V with respect to the low potential of the upper electrode, is produced thereby attaining high stability of the sensor characteristics.

From the foregoing description, it will be understood that a depletion layer is formed in the photoelectric converting semiconductor layer by applying a suitable level of negative bias voltage to the gate electrode constituted by the light-shielding layer 112, 202, and that the unfavourable effect produced by the dark current is eliminated to improve the S/N ratio while attaining a high linearity of the light-quantity-dependency.

Figure 7:
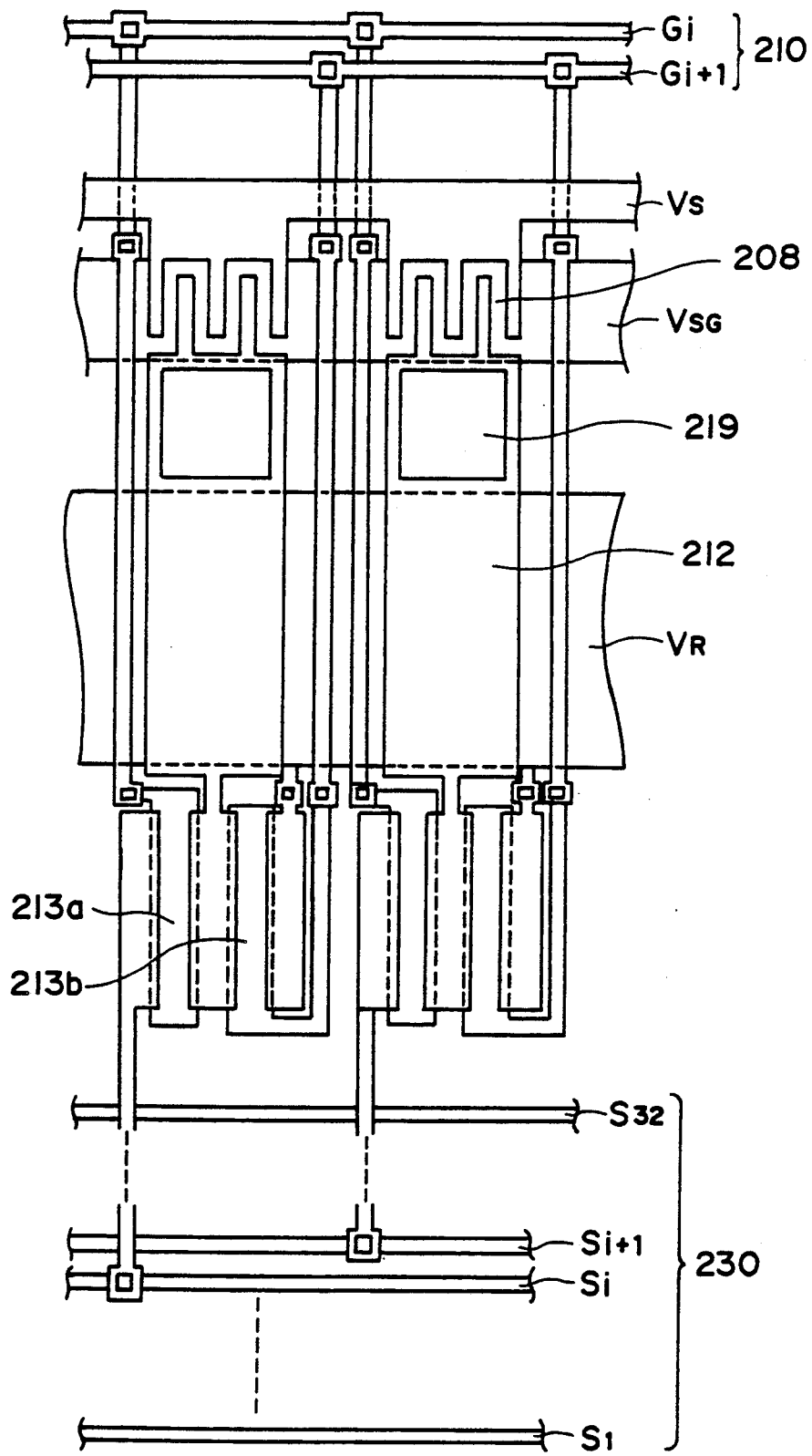
FIG. 7 is a schematic plan view of an essential portion of a third embodiment of the image reading device in accordance with the present invention.

FIG. 7 shows another embodiment of the image reading device in which the photo-sensor unit, charge accumulating unit and the switch unit are formed as a unit. In this Figure, the same reference numerals are used to denote the parts or members which may have the same constructions as those in the embodiment shown in FIGS. 3A to 3C. In FIG. 7, a reference numeral 230 denotes an output signal matrix.

Figure 8:
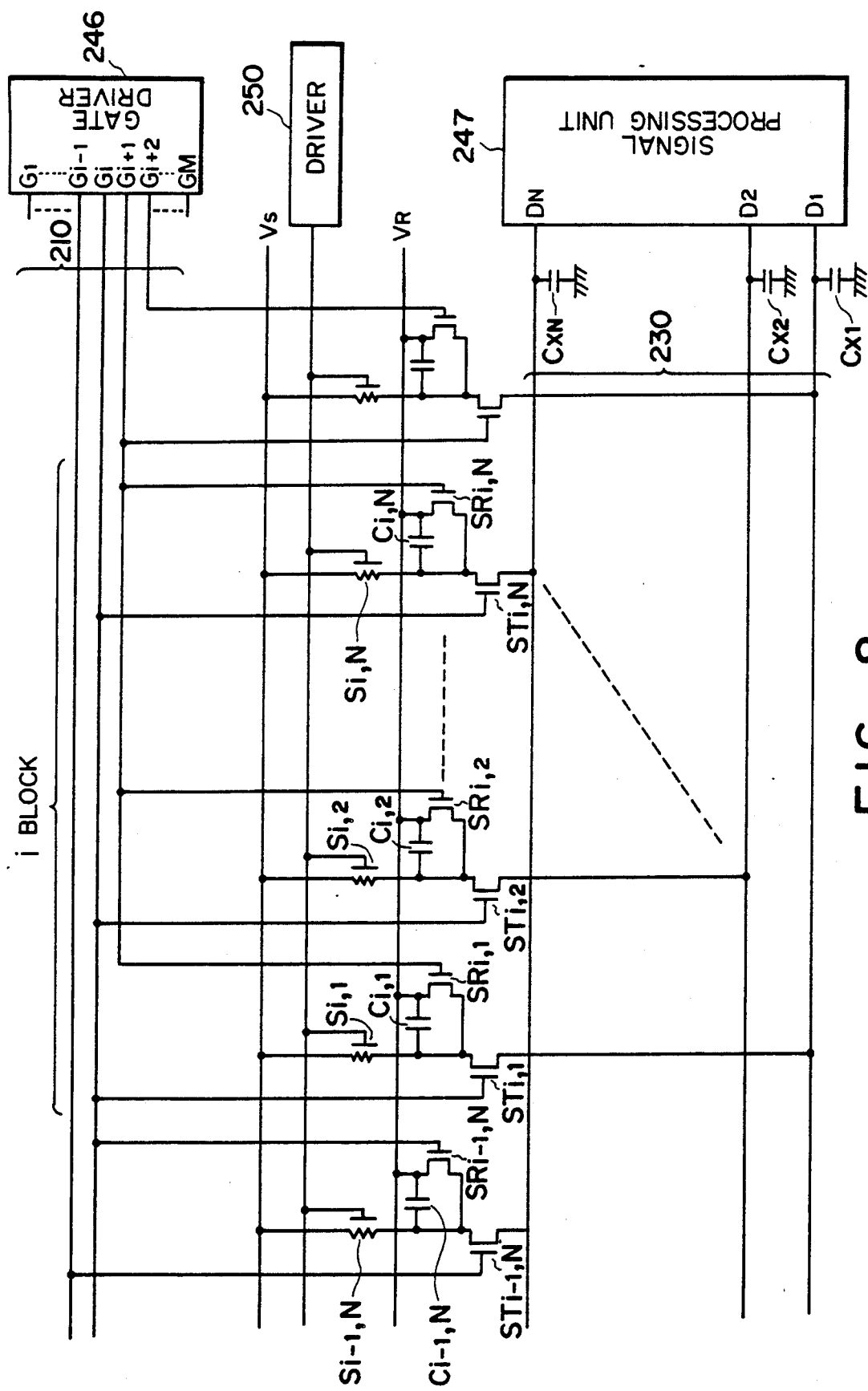
FIG. 8 is an equivalent circuit diagram of an equivalent circuit of the image reading device as shown in FIG. 7.

FIG. 8 shows a circuit which is equivalent to the device shown in FIG. 7.

The device of this embodiment has photo-sensor units $S_{i,1}$, $S_{i,2}$, ..., $S_{i,N}$ (represents by $S_i$ hereinunder, i represents block No., and 1 to N represent bit Nos. in each block) corresponding to the photosensor units 208. The device also has accumulating capacitors $C_{i,1}$, $C_{i,2}$, ..., $C_{i,N}$ (represented by $C_i$ hereinunder) corresponding to the charge accumulating units 212, transfer switches $ST_{i,1}$, $ST_{i,2}$, ..., $ST_{i,N}$ (represented by $ST_i$ hereinunder) corresponding to the transfer switches 213a and adapted for transferring the charges of the accumulating capacitors $C_i$ to load capacitors $CX_1$, $CX_2$, ..., $CX_N$ (corresponding to accumulating capacitors 223), and discharge switches $SR_{i,1}$, $SR_{i,2}$, ..., $SR_{i,N}$ (represented by $SR_i$ hereinunder) corresponding to the discharge switches 213b and adapted for resetting the charge accumulating capacitors $C_i$.

The photo-sensor $S_i$, accumulating capacitors $C_i$, transfer switches $ST_i$ and the discharge switches $SR_i$ are arrayed in respective rows. The image reading device of this embodiment is sectioned into M blocks each including N pieces of photo-sensor units SY1, N pieces of accumulating capacitors $CY_i$, N pieces of transfer switches $ST_i$ and N pieces of discharge switches $SR_i$. For instance, when a line sensor is composed of 1728 such units, these units are divided into M blocks, e.g., 54 blocks, each containing N units, e.g., 32 units. The gate electrodes of the transfer switches $ST_i$ and discharge switches $SR_i$ arranged in arrays are connected to the matrix wiring portion 210. The gate electrodes of the transfer switches STY1 in each block are commonly connected in each block i. The gate electrodes of the discharge switches $SR_i$ of each block are commonly connected the gate electrodes of the transfer switches in the next block.

The common wiring (gate driving lines G1, G2, ..., GN) of the matrix wiring 210 are driven by a gate driving unit 246. On the other hand, the signal outputs are connected on the block basis to the signal processing unit 247 through lead lines 214, i.e., signal output lines D1, D2, ..., DN which are arranged in the form of a matrix.

The gate electrodes (light-shielding layers 202) of the photo-sensor units $S_{1,1}$, ..., $S_{1,N}$, $S_{2,1}$, ..., $S_{M,N}$ are connected to a driving source 250 and are supplied with negative bias voltage.

The gate driving lines G1, G2, ..., GN are successively supplied with selection pulses VG1, VG2, VG3, ..., VGN from the gate driving unit 246. When the gate driving line G1 is selected, the transfer switch $ST_1$ is turned on and the charges accumulated in the charge accumulating capacitor C1 are transferred to the load capacitors $CX_1$ to $CX_N$. Then, the next gate driving line G2 is selected so that the next transfer switch $ST_2$ is turned on, whereby the charges accumulated in the charge accumulating capacitor $C_2$ are transferred to the load capacitors $CX_1$ to $CX_{32}$ and, at the same time, the accumulating capacitor C1 is reset by means of the discharge switch $SR_1$. In a like manner, driving lines G3, G4, ..., GN are successively selected and a reading operation is successively conducted. This operation is conducted for each of the plurality of blocks. The outputs VX1, VX2, ..., VXN are transmitted to the input sections D1, D2, ..., DN of the signal processing unit 247 so as to be changed into a serial output signal from the signal processing unit 247.

It will be understood that this embodiment also eliminates the undesirable effect of dark current so as to exhibit improved S/N ratio and high linearity of the light-quantity-dependency, by changing the photoelectric converting semiconductor layer into a depletion layer, through application of a suitable level of negative bias voltage to the gate electrodes of the photo-sensor $S_i$.

Figure 9:
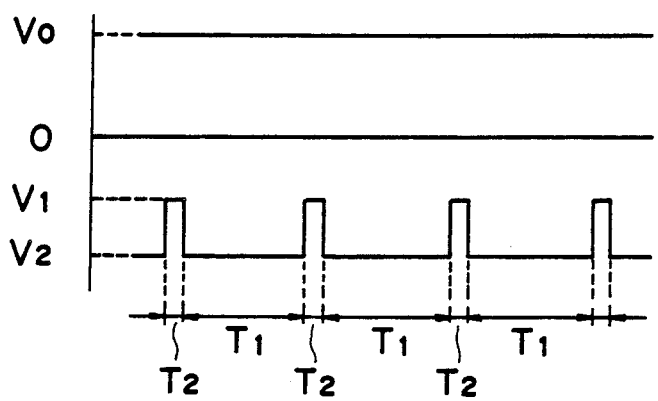
FIG. 9 is a timing chart illustrating a voltage waveform in a preferred example of driving of the image reading device in accordance with the present invention.

FIG. 9 is a timing chart illustrating an example of the driving of the photo-sensors in the image reading apparatus embodying the present invention. In this case, the semiconductor layers 12 shown in FIGS. 2A and 3A are of n-type.

Referring to FIG. 9, a voltage $V_0$ is applied between the main electrode 117 or 217 and the main electrode 116 or 216, maintaining the main electrode 116 or 216 at a base level. The voltage $V_0$ is a positive voltage, i.e., the condition of $V_0 > 0$ is met.

Throughout the reading period $T_1$ of the sensor operation, a bias voltage $V_1$ is applied by a driving unit 250 (see FIG. 4 or 6) to the light-shielding layer 112 or 202 constituting an electrode. In view of the fact that the semiconductor layer 14 is of n-type, the bias voltage is selected to meet the condition of $V_1 < 0$.

Another voltage $V_2$ is applied to the light-shielding layer 112 or 202 in the non-reading period $T_2$ of the sensor operation. The voltage $V_2$ is selected to meet the condition of $V_1 < V_2 < 0$.

By shifting the level of the bias voltage to the positive side during the non-reading period $T_{23}$, it is possible to remarkably increase the rate of rise of the output current as will be understood from the following description.

Figure 10A:
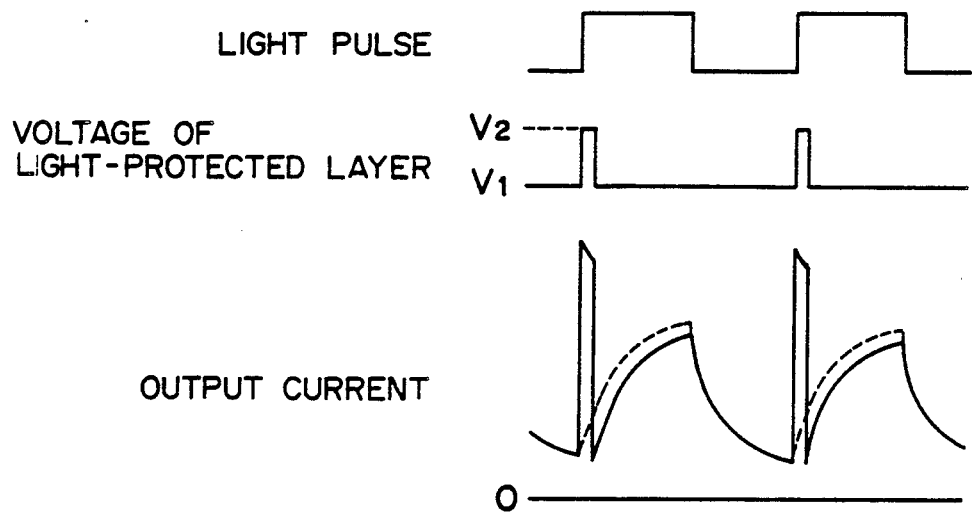
FIGS. 10A and 10B are waveform charts illustrating a change in the output current.
Figure 10B:
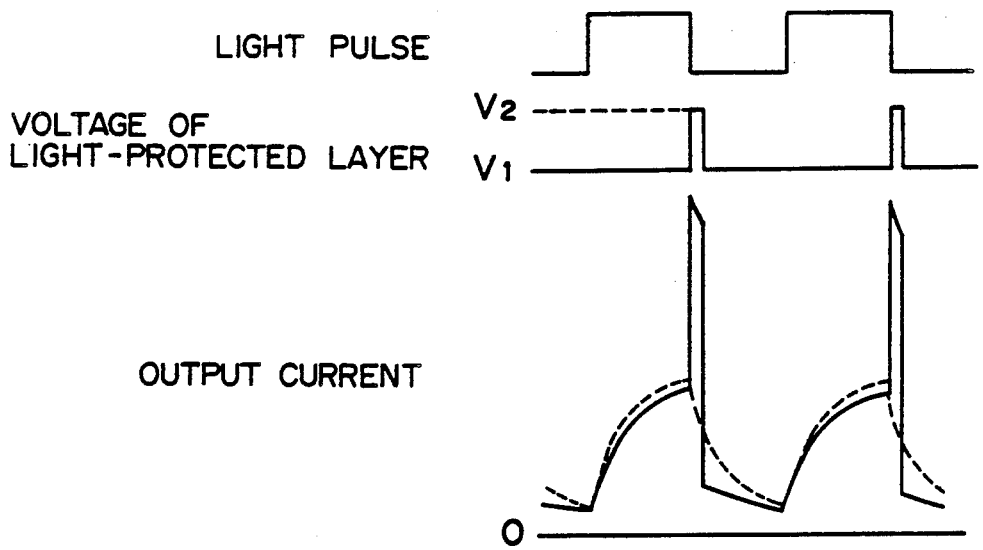

FIGS. 10A and 10B are waveform charts for explaining the change in the output current. More specifically, FIG. 10A shows the change in the output current as observed when the light pulse is applied immediately before the commencement of the reading operation, while FIG. 10B shows the change in the output current as observed when the light has been applied down to a moment immediately before the commencement of the reading operation.

Referring to FIG. 10A, it is assumed here that the bias voltage $V_1$ and the pulse voltage $V_2$ are $-3V$ and $-2.8V$, respectively. When the pulse voltage $V_2$ is applied to the light shielding layer 112 or 212 to start the reading, the potential of the light-shielding layer 112 or 212 is shifted to the positive side so that a large electric current flows due to injection of electrons into the semiconductor layer 14 from the main electrode 116 or 216. The thus injected electrons serve to promote the re-bonding of electrons to holes in the semiconductor layer 14. In consequence, the semiconductor layer 14 has a smaller number of holes so that, when the light is applied, the rise of the output current is slightly delayed as compared with the case where the potential of the light-shielding layer 112, 202 is fixed. For information, the change in the output current as observed when the potential of the light shielding layer is fixed is shown by a broken-line curve. Nevertheless, the waveform of the output current conforms with the light pulse so that the amount of charges accumulated by the output current represents the light information carried by the incident light.

Referring now to FIG. 10B, it will be seen that the output current corresponds to the light pulse also in the case where the light has been applied to a moment immediately before the commencement of reading. Namely, the re-bonding of holes in the semiconductor layer 14 is promoted also in this case by the electrons injected into the semiconductor layer 14 as a result of application of the pulse voltage $V_2$ to the light shielding layer 112 or 212. Therefore, when the bias voltage $V_1$ is resumed on the light shielding layer 112 or 212, there are no surplus holes, so that the current level corresponding to the dark state is maintained to enable the output current to rise in response to the light input.

It is thus possible to eliminate inconveniences such as those caused when the potential of the light shielding layer 112 or 212 is fixed at the bias level $V_1$ (see broken-line curve in FIG. 9) and the unfavourable effect produced by the preceding output signal on the succeeding electrode, by applying the pulse voltage $V_2$ to the light-shielding layer 112 or 212 immediately before the commencement of the reading so as to reset the photo-sensor.

It is therefore possible to obtain an output signal which precisely corresponds to the incident light and, at the same time, to attain a higher response speed to the input light and higher speed of the reading operation.

In the described embodiments, the output signals from the photo-sensors are accumulated in the capacitors so as to obtain light information. This driving system, however, is only illustrative and other types of driving method are usable provided that they produce an output current precisely corresponding to the incident light.

The carriers carrying the electric current flowing through the semiconductor layer of the photosensors in the described embodiment are electrons. It will be obvious to those skilled in the art that described embodiments can be realized equally by using p- or i-type semiconductor layer 14 which employ holes as the carriers of the electric current, though the polarities of the voltages have to be inverted. Thus, the voltages are selected to meet the condition of $V_1<V_2<0$ when the carriers are electrons as in the described embodiments, whereas, when the carriers are holes, the voltages are selected to meet the condition of $V_1>V_2>0$.

When the semiconductor layer 14 is of i-type, the carriers carrying the electric current are determined in accordance with the conduction type of the ohmic contact layer 15 or 205.

In the described driving method, it is possible to completely eliminate any influence of the preceding reading output by applying to the light shielding layer a voltage of the same polarity as the bias voltage but having a smaller absolute value than the bias voltage, during the non-reading period of the operation. In consequence, the response to the input light is improved and the reading output correctly corresponding to the operation. In consequence, the response to the input light is improved and the reading output correctly corresponding to the input light can be obtained stably. Thus, the image reading device of this embodiment exhibits response to incident light which is much superior as compared with that of known devices.

The embodiment can be constructed such as to have a line sensor having a multiplicity of pixel sensors each having the described construction and operation. With such a line sensor, it is possible to read the original image at a high speed.

Figure 11:
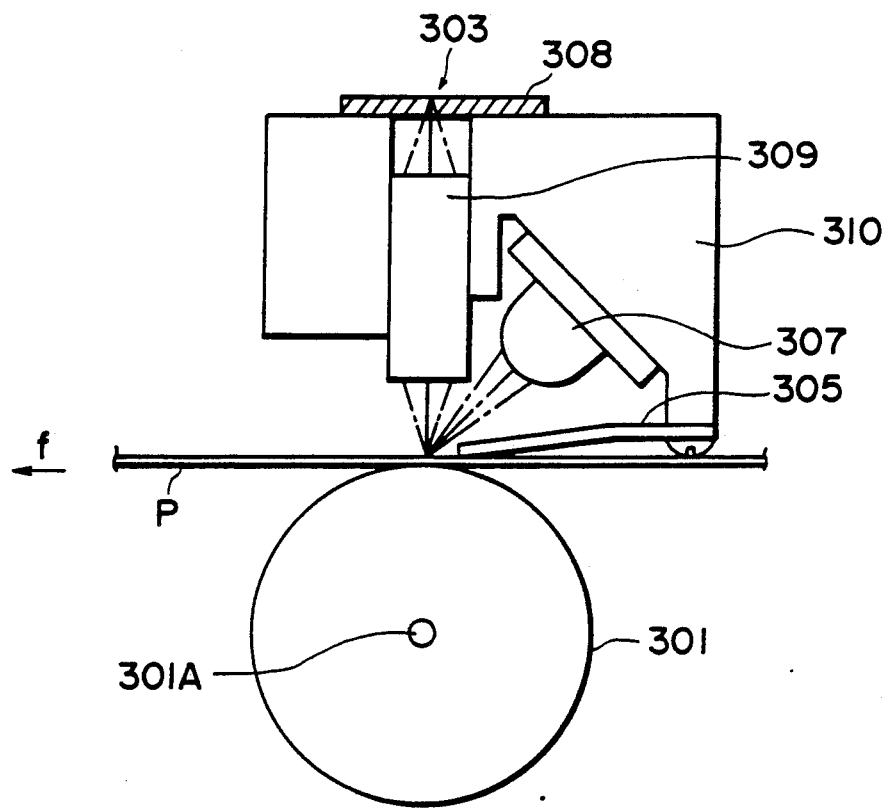
FIG. 11 is a schematic illustration of a fourth embodiment of the image reading device in accordance with the present invention.

FIG. 11 shows still another embodiment of the image reading device of the present invention. This embodiment features the use of a real-size line sensor. An original P is adapted to be fed by a feed roller 301 in a direction which is indicated by an arrow f. The feed roller 301 has a shaft which is rotatably supported on a suitable portion of the body portion of an image reading apparatus. The image reading apparatus further has a reading section 303 disposed such as oppose to the feed roller 301. The reading section 303 includes a leaf spring 305 which is a member for elastically pressing the original P onto the feed roller 301 over the entire width of the original P, an LED array 307 as means for illuminating the original P, an optical system 309 composed of converging optical fibers for converging the light reflected from the original P, a photoelectric conversion section 308 including photoelectric conversion elements (photo-sensors) for converting the converged light into electric signals, and a structural part 310 which holds the above-mentioned constituents of the reading section 303.

In operation, the feed roller 301 is driven by a suitable driving means (not shown) so that the original P pressed onto the feed roller 301 by the pressing member 305 is fed in the direction of the arrow f. During feeding of the original P, the image carrying surface of the original is illuminated by the LED array 307 and the light reflected from the image-carrying surface is transmitted through the optical system 309 to the photoelectric conversion section 308, whereby the image on the original P is read successively.

Figure 12:
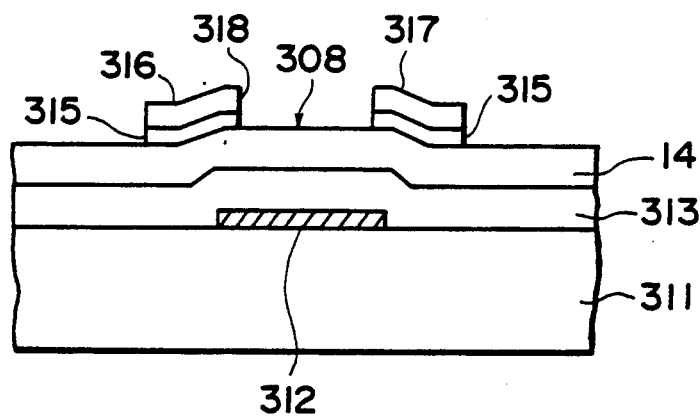
FIG. 12 is a schematic sectional view of an example of the photoelectric conversion section in the device shown in FIG. 11.

FIG. 12 shows an example of the photo-sensor unit constituting the photoelectric conversion section 308. The photo-sensor has an insulating substrate 311 made of glass or ceramics, on which are formed an auxiliary electrode 312 and an insulating layer 313. The auxiliary electrode 312 and the insulating layer 313 are overlain by a semiconductor layer 14 which in turn is overlain by a pair of main electrodes 316 and 317 through an intermediary of a doped semiconductor layer 315 for attaining ohmic contact. The space between the main electrodes 316 and 317 constitutes a light-receiving window 318. The configurations and other conditions of the electrodes 312, 316 and 317 may be the same as those in the embodiment described in connection with FIGS. 3A to 3B.

In operation, the light L reflected by the image impinges upon the surface of the semiconductor layer 14 through the light-receiving window 318, while a driving voltage of a high level is applied between the main electrode 317 and the main electrode 316 such that the electrode 317 has the higher potential. In consequence, a change is caused in the electric current flowing through the semiconductor layer 14 between the electrodes 316 and 317, and this change in the electric current is picked up as the output signal representing the read image data. It is possible to stabilize the output of the photo-sensor and to attain a high degree of correspondence between the intensity of the received light and the level of the output current, by applying to the auxiliary electrode 312 a suitable level of voltage as discussed in this specification.

The sensor unit corresponds to one bit (cell) of the image reading device. It is possible to form a real-size one-dimensional line sensor by arraying a plurality of such sensor units on a substrate 11. For instance, by arraying 1728 pieces of such sensor a unit in the direction of the width of the original P, i.e., in the direction perpendicular to the original feeding direction indicated by an arrow in FIG. 11, it is possible to obtain a reading resolution of 8 lines/mm over a width (216 mm) of A-4 size paper. As in the embodiment explained in connection with FIGS. 3A to 3C, the image reading device of this embodiment further has charge accumulating units (capacitor units) for accumulating the outputs from the photo-sensor units, switch units for transferring the accumulated charges for the purpose of signal processing, and necessary wiring patterns. These units may be formed on the substrate in a single production process.

Figure 13:
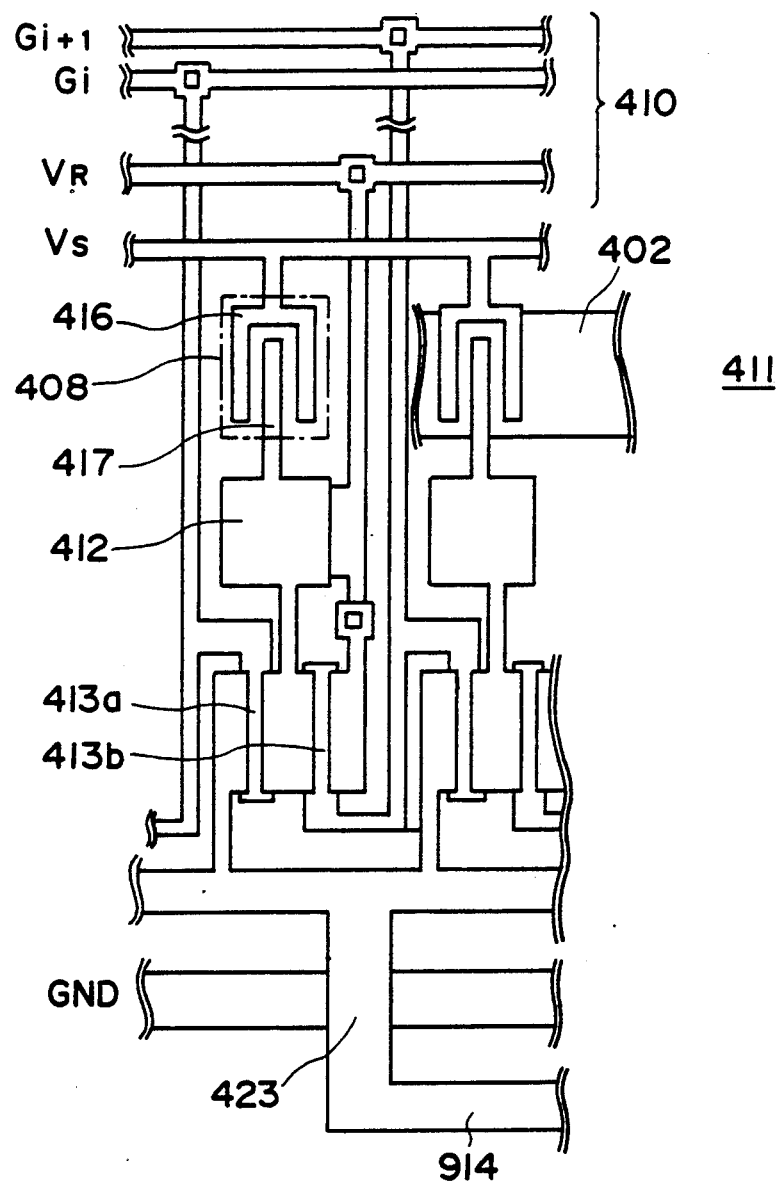
FIG. 13 is a schematic plan view of an essential portion of a fifth embodiment of the image reading device in accordance with the present invention.

FIG. 13 is a plan view of a second embodiment in which the photo-sensor units, charge accumulating units and switch units are formed integrally.

This embodiment of the image reading device has a plurality of units each having a gate matrix wiring portion 410, a photo-sensor unit 408, a charge accumulating unit 412, a switch unit 413 including a transfer switch 413a and a discharge switch 413b for resetting the charge accumulating unit 412, wiring for transferring the output from the transfer switch 413a to a later-mentioned signal processing unit, and a load capacitor 423 for accumulating and reading the charges transferred through the transfer switch 413a. These constituents may be arranged in a laminated structure similar to that constituted by elements 210, 208, 212, 213 and 223 in the embodiment shown in FIG. 3A to 3C.

In FIG. 13, numerals 416 and 417 denote electrode wirings serving as source and drain electrodes, respectively, while 402 denotes an auxiliary electrode wiring serving as a gate electrode. The auxiliary electrode is connected to a later-mentioned driving unit. This embodiment of an image reading device is devoid of any light-incidence window because it is not designed to be illuminated from the reverse side of the substrate 411.

The line sensor having the described construction can be produced by a single process because all of the constituents such as the photo-sensor unit, charge accumulating unit, transfer switch, discharge switch and matrix wirings have laminated structures including layers such as the photoconductive semiconductor layer and the insulating layer.

Figure 14:
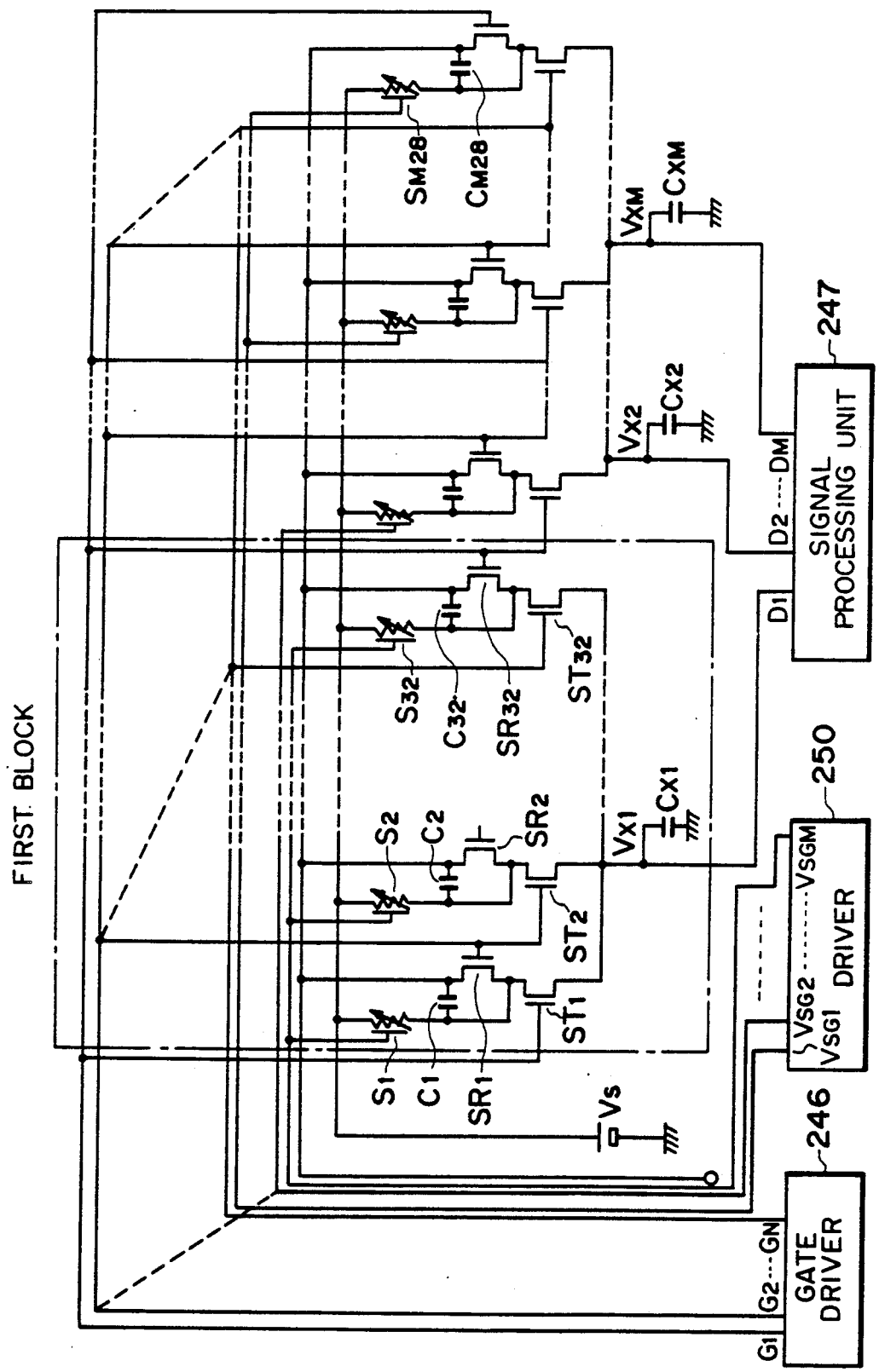
FIG. 14 is an example of an equivalent circuit diagram of an equivalent circuit of the embodiment shown in FIG. 13.

FIG. 14 shows a circuit which is equivalent to the image reading device as shown in FIG. 13. This circuit may be used also as an alternative of the equivalent circuit of the embodiment shown in FIGS. 3A to 3C.

The circuit includes photo-sensor units S1, S2, ..., SN (represented by SY1, hereinafter) corresponding to the photo-sensor units 208 or 408, charge accumulating capacitors C1, C2, ..., CN (hereinafter CY1) constituting the charge accumulating units 212 or 412 adapted for accumulating the photoelectric current from the photo-sensor units SY1, transfer switch units ST1, ST2, ..., STN (hereinafter STY1) corresponding to the transfer switches 213a or 413a and adapted for transferring the charges of the accumulating capacitors CY1 to load capacitors CX1 which correspond to the load capacitors 223 or 423, and discharge switches SR1, SR2, ...,SRN (hereinafter SRY1) corresponding to the discharge switches 213b or 413a and adapted for resetting the charges on the accumulating capacitors CY1.

The photo-sensor SY1, accumulating capacitors CY1, transfer switches STY1 and the discharge switches SRY1 are arrayed in respective rows. The image reading device of this embodiment is sectioned into M blocks each including N pieces of photo-sensor units SY1, N pieces of accumulating capacitors CY1, N pieces of transfer switches STY1 and N pieces of discharge switches SRY1. For instance, when a line sensor is composed of 1728 of such units, these units are divided into M blocks, e.g., 54 blocks, each containing N units, e.g., 32 units. The gate electrodes of the transfer switches STY1 and discharge switches SRY1 arranged in arrays are connected to the matrix wiring portion 210. The gate electrode of each transfer switch $STY_i$ is commonly connected to the gate electrodes of the transfer switches STY1 of the same order in other blocks i. The gate electrodes of the discharge switches $SR_i$ in each block are connected in a cyclical manner to the gate electrodes of the transfer switches of the next order in the same block.

The common wiring (gate driving lines G1, G2 ..., GN) of the matrix wiring 210 or 410 are driven by a gate driving unit 246. On the other hand, the signal output is connected to the signal processing unit 247 through lead lines 214 or 414, i.e., signal output lines D1, D2, ..., DM.

The gate electrodes (light-shielding layers 202 or auxiliary electrode 402) of the photo-sensor units S1, .., SN, ..., SN×M of the respective blocks are connected to a driving source 250 and are supplied with suitable levels of bias voltages VSG1, ..., VSGM so that a photoelectric current with no substantial local distribution is obtained. Thus, different blocks receive different levels of the biasing voltage $V_{sg}$. The means for applying different levels of biasing voltage to different blocks may be constituted by a variable-voltage power supply with different volumes adjustable for the respective blocks at the time of manufacture of the image reading device. Alternatively, variable-gain amplifiers are used under the control of a controller having a CPU and a memory device, so as to be adjusted in accordance with the values read from the memory at the time of initialization of the image reading device.

The gate driving lines G1, G2, ..., GN are successively supplied with selection pulses VG1, VG2, VG3, ..., VGN from the gate driving unit 246. When the gate driving line G1 is selected, the transfer switch ST1 is turned on and the charges accumulated in the charge accumulating capacitor C1 are transferred to the load capacitor CX1. Then, the next gate driving line G2 is selected so that the next transfer switch ST2 is turned on, whereby the charges accumulated in the charge accumulating capacitor C2 are transferred to the load capacitor CX1 and, at the same time, the accumulating capacitor C1 is reset by means of the discharge switch SR1. In the like manner, driving lines G3, G4, ..., GN are successively selected and reading operations are successively conducted. This operation is conducted for each of the plurality of blocks. The outputs VX1, VX2, ..., VXM are transmitted to the input sections D1, D2, ..., DM of the signal processing unit 247 so as to be changed into a serial output signal from the signal processing unit 247.

Figure 15:
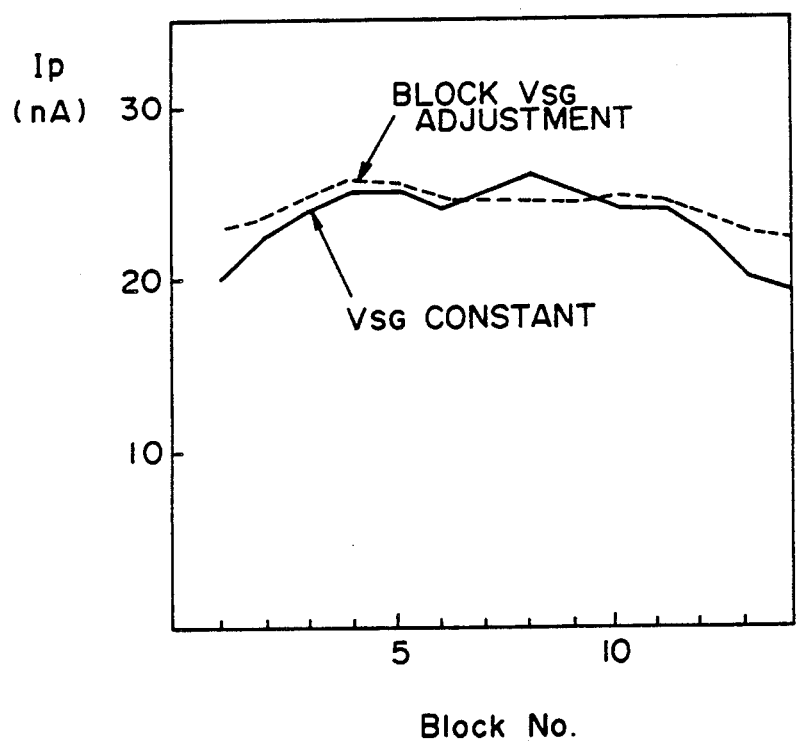
FIG. 15 is a graph showing the characteristics of a photo-sensor unit composed of a plurality of blocks, illustrating particularly the relationship between the bias voltage $V_{sg}$ and the photoelectric current $I_p$ in each block.

FIG. 15 shows the result of a measurement of the photoelectric current $I_p$ produced in a one-dimensional line sensor as an example of the photo-sensor constituting an image reading device of the present invention, the line sensor being sectioned into 14 blocks. The measuring result as obtained when the levels of the bias voltage $V_{sg}$ was varied for the respective blocks is shown by a broken-line curve, while the result as obtained when the bias voltage $V_{sg}$ was not adjusted is shown by a solid-line curve. The measurement was conducted such that the light was applied substantially uniformly in the direction of the width of an original having a uniform surface condition so that the reflected light impinged upon the line sensor substantially uniformly over the length of the line sensor. From this Figure, it will be understood that the distribution of the photoelectric current is remarkably flattened when the bias voltage $V_{sg}$ is varied for the respective blocks as compared with the case where the bias voltage $V_{sg}$ is not adjusted. This means that a constant level Of the photoelectric current is obtained over the entire length of the line sensor provided that bias voltage $V_{sg}$ is suitably adjusted along the length of the line sensor. This in turn eliminates the necessity for an expensive correction circuit which is essentially required in the signal processing circuit 247 in the known image reading devices or, alternatively, to simplify the construction and to reduce the production cost of such a correction circuit.

Figure 16:
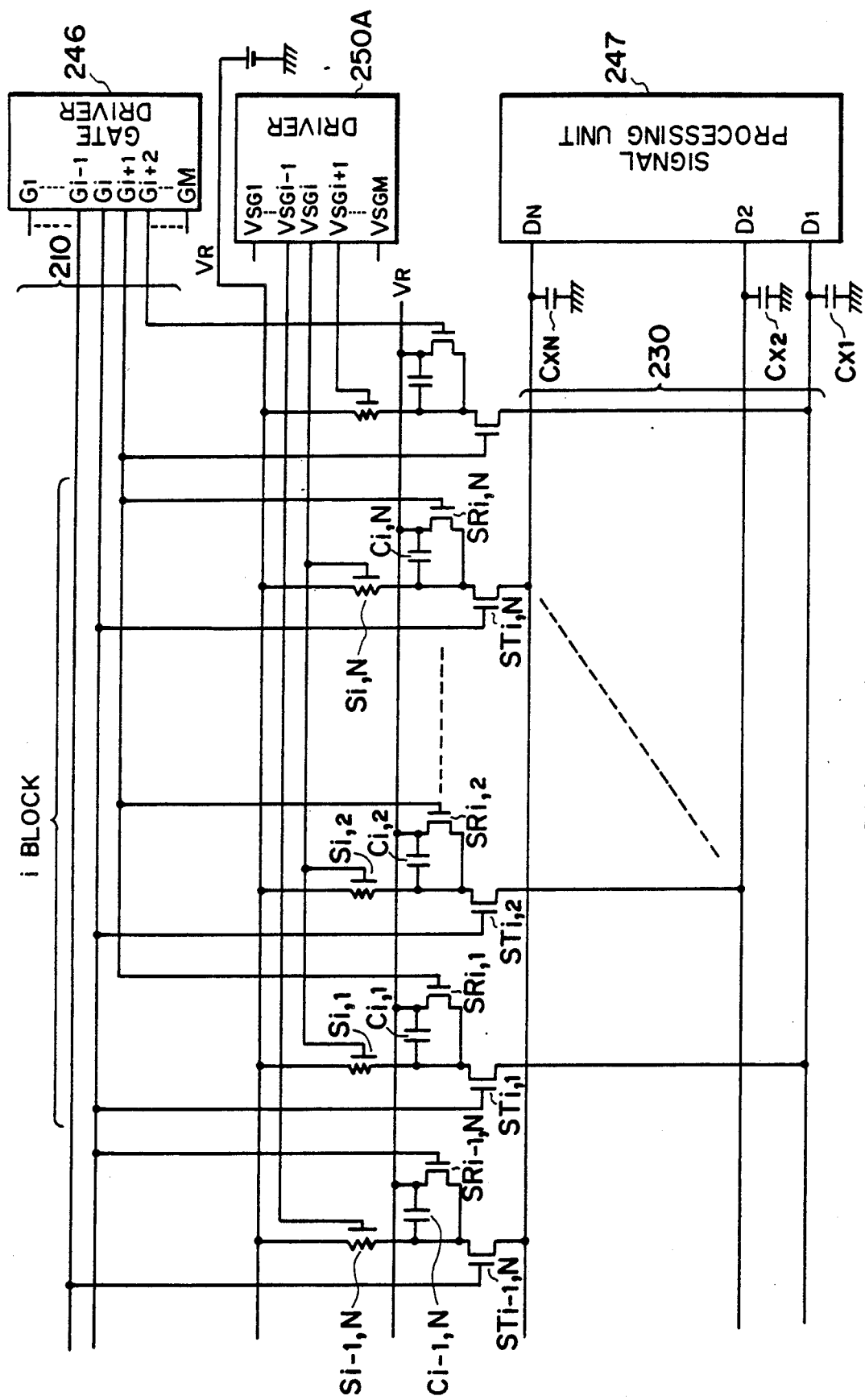
FIG. 16 is an equivalent circuit diagram of another equivalent circuit of the device shown in FIG. 8.

FIG. 16 shows a modification of the equivalent circuit shown in FIG. 8. In this Figure, the same reference numerals are used to denote the same parts or members as those appearing in FIG. 3.

Photo-sensor units $S_{i,1}, S_{i,2}, \ldots S_{i,N}$ (represented by $S_i$ hereinunder) correspond to the photo-sensor units 208. The equivalent circuit also has accumulating capacitors $C_{i,1}, C_{i,2}, \ldots C_{i,N}$ (represented by $C_i$ hereinunder) corresponding to the charge accumulating units 212, transfer switches $ST_{i,1}, ST_{i,2}, \ldots ST_{i,N}$ (represented by $ST_i$ hereinunder) corresponding to the transfer switches 213a and adapted for transferring the charges of the accumulating capacitors $C_i$ to load capacitors $CX_1, CX_2, \ldots CX_N$ (correspond to accumulating capacitors 223), and discharge switches $SR_{i,1}, SR_{i,2}, \ldots SR_{i,N}$ (represented by $SR_i$ hereinunder) corresponding to the discharge switches 213b and adapted for resetting the charge accumulating capacitors $C_i$.

The photo-sensor units $S_i$, accumulating capacitors $C_i$, transfer switches $ST_i$ and the discharge switches $SR_i$ are arrayed in respective rows. The image reading device of this embodiment is sectioned into M blocks each including N pieces of photo-sensor units SY1, N pieces of accumulating capacitors $CY_i$, N pieces of transfer switches $ST_i$ and N pieces of discharge switches $SR_i$. For instance, when a line sensor is composed 1728 of such units, these units are divided into M blocks, e.g., 54 blocks, each containing N units, e.g., 32 units. The gate electrodes of the transfer switches STY and discharge switches SRY1 arranged in arrays are connected to the matrix wiring portion 210. The gate electrode of the transfer switches $ST_i$ in the same block are commonly connected. The gate electrodes of the discharge switches $SR_i$ of each block are connected commonly and are connected to the gate electrodes of the transfer switches of the next block.

The common wiring (gate driving lines G1, G2, ... GN) of the matrix wiring 210 are driven by a gate driving unit 246. On the other hand, the signal outputs are connected to the signal processing unit 247 through lead lines 230 (signal output lines D1, D2, ..., DN) arranged in the form of a matrix.

The gate electrodes (light-shielding layers 202) of the photo-sensor units $S_{1,1}, \ldots, S_{1,N}, S_{2,1}, \ldots, S_{M,N}$ are connected to a driving source 250A on a block basis and are supplied with suitable levels of bias voltages VSG1, VSG2, ..., VSGM so as to produce a flat distribution of photoelectric current.

The means for applying different levels of biasing voltages to the respective blocks may be constituted by a variable power supply with volumes corresponding to the respective blocks, the volumes being adjusted at the time of manufacture of the image reading device or, alternatively, variable-gain amplifiers are used under the control of a controller having a CPU and a memory such that the controller adjusts the amplifiers in accordance with values read from the memory at the time of initialization of the image reading device.

The gate driving lines G1, G2, ..., GN are successively supplied with selection pulses VG1, VG2, VG3, ..., VGN from the gate driving unit 246. When the gate driving line G1 is selected, the transfer switch $ST_1$ is turned on and the charges accumulated in the charge accumulating capacitor C1 are transferred to the load capacitors $CX_1$ to $CX_x$. Then, the next gate driving line G2 is selected so that the next transfer switch $ST_2$ is turned on, whereby the charges accumulated in the charge accumulating capacitor C2 are transferred to the load capacitors $CX_1$ to CXN and, at the same time, the accumulating capacitor C1 is reset by means of a discharge switch SR1. In the like manner, driving lines G3, G4, ..., GN are successively selected and reading operations are successively conducted. This operation is conducted for each of the plurality of blocks. The outputs VX1, VX2, ..., VXN are transmitted to the input sections D1, D2, ..., DN of the signal processing unit 247 so as to be changed into a serial output signal from the signal processing unit 247. It will be understood that the embodiment explained hereinabove with reference to FIG. 16 produces the same advantages as that produced by the embodiment shown in FIG. 14.

Although in the embodiment shown in FIG. 16 the sensor units are grouped into a plurality of blocks which are applied with different adjusted levels of bias voltage $V_{sg}$, whether the sensor units are grouped into blocks or, when grouped, the number of the blocks do not constitute any critical portion of the invention. In other words, it is not essential that the sensor units are grouped into blocks and, if they are grouped into blocks, the number of such blocks may be varied as desired.

Figure 17:
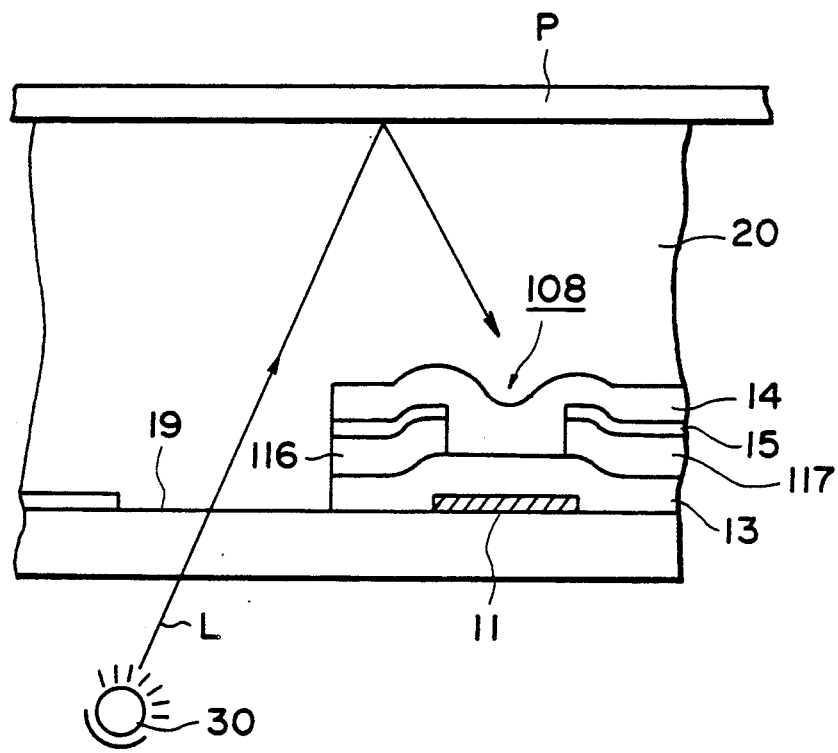
FIG. 17 is a schematic sectional view showing an essential portion of a sixth embodiment of the image reading device in accordance with the present invention.

The described embodiments are of staggered type in which the main electrodes and the light-shielding portions are arranged on opposite sides of the semiconductor layer. This, however, is not exclusive and the same advantages are brought about by a modification in which, as shown in FIG. 17, main electrodes 116, 117 made of Al or the like material are formed on the same side of the semiconductor layer 14 as the light-shielding layer 11.

As will be understood from the foregoing description, the present invention provides an image reading device having a sensor portion which is improved to meet various demands so as to ensure a stable reading of an image with high quality reading output.

In addition, the image reading device of the invention enables the outputs of the photo-sensor units to be adjusted easily, so as to provide an improved output distribution along the length of a one-dimensional line sensor when such a line sensor is used.

In consequence, any expensive correction circuit which hitherto has been necessary is completely eliminated or, if not, the correction circuit may be substituted by a less-expensive one.

This in turn lowers the cost of production of image reading devices incorporating such a line sensor.

What is claimed is:

1. An image reading device having photosensor units each including a light-shielding layer formed on a light-transmitting substrate, an insulating layer formed on said light-shielding layer, a semiconductor layer disposed on said insulating layer, and a pair of upper electrodes provided on said semiconductor layer and spaced from each other, the space between said upper electrodes constituting a light-receiving window through which said semiconductor layer receives the light applied from a side opposite to a side of said substrate on which an original is conveyed onto the surface of an image-carrying original and reflected by the original, so that said semiconductor layer produces an electrical signal representing the read image, said image reading device comprising:
   an electrically conductive layer comprising said light shielding layer; and
   voltage application means for applying to said light-shielding layer a voltage of a level which is lower than levels of voltages applied to aid pair of upper electrodes, said voltage application means applying to said light-shielding layer a voltage of opposite polarity and smaller absolute value than a voltage applied to the upper electrodes.

2. An image reading device according to claim 1, wherein the level of said voltage applied by said voltage application means is sufficiently high to change said semiconductor layer into a depletion layer over the entire thickness of said semiconductor layer.

3. An image reading device according to claim 1, further comprising a plurality of said photo-sensor units arrayed on said substrate so as to constitute a one-dimensional sensor array.

4. An image reading device having photosensor units each including a light-shielding layer formed on a light-transmission substrate, an insulating layer formed on said light-shielding layer, a semiconductor layer disposed on said insulating layer, and a pair of upper electrodes provided on said semiconductor layer and spaced from each other, the space between said upper electrodes constituting a light-receiving window through which said semiconductor layer receives light applied from a side opposite to a side of said substrate on which an original is conveyed onto the surface of an image-carrying original and reflected by the original, so that said semiconductor layer produces an electrical signal representing the read image, said image reading device comprising:
   an electrically conductive layer comprising said light-shielding layer; and
   voltage application means adapted to apply to said light-shielding layer a bias voltage of a polarity determined in accordance with the polarity of the carriers carrying the photoelectric current generated in said semiconductor layer and of a level determined in accordance with the quantity of the charge of said carriers, said voltage application means being further adapted to apply, in the non-reading period of the reading operation, a voltage $V_8$ having the same polarity as said bias voltage and an absolute value smaller than that of said bias voltage.

5. An image reading device according to claim 4, wherein said voltage $V_a$ is applied to said light-shielding layer for a predetermined period immediately before the commencement of the reading operation.

6. An image reading device having a plurality of photo-sensors arrayed on a substrate in a predetermined direction and each including an electrically conductive layer, an insulating layer formed on said conductive layer, a semiconductor layer disposed on said insulating layer and a pair of main electrodes provided in contact with said semiconductor layer and spaced from each other, said image reading device comprising:
   a bias voltage applicator for applying a bias voltage to each said conductive layer, a level of said bias voltage being varied in the predetermined direction.

7. An image reading device according to claim 6, wherein said photo-sensors are arranged linearly on aid substrate in the direction of a width of the original.

8. An image reading device according to claim 1, wherein the array of said photo-sensor units has a length corresponding to a width of an original carrying the image to be read.

9. An image reading device according to claim 7, wherein the array of said photo-sensor units is grouped into a plurality of blocks each having a predetermined number of said photo-sensor units, said bias voltage application means being designed to apply different levels of biasing voltage to different blocks of said photo-sensor units.

10. An image reading device according to claim 6, wherein said substrate is made of a transparent material, and wherein said semiconductor layer receives, through a window constituted by the space between said pair of main electrodes, the light which is applied from a side opposite to a side of said substrate on which an original is conveyed onto an original carrying an image to be read and reflected by said original.

11. A method for reading an image comprising the steps of:
   providing a photosensor having a light-shielding layer formed on a light-transmitting substrate, an insulating layer formed on said light-shielding layer, a semiconductor layer disposed on said insulating layer and a pair of upper electrodes disposed at a predetermined space and contacting said semiconductor layer;
   applying a voltage to said upper electrodes;
   applying a voltage to said light-shielding layer of said photosensor which is lower than a voltage applied to said upper electrodes, thereby spreading a depletion layer over said semiconductor layer in a direction of the thickness thereof; and
outputting a signal from said photosensor.

12. An image reading device having a photosensor units each including a light-shielding layer formed on a light-transmitting substrate, an insulating layer formed on said light-shielding layer, a semiconductor layer disposed on said insulating layer, and a pair of upper electrodes provided on said semiconductor layer and spaced from each other, the space between said upper electrodes constituting a light-receiving window through which said semiconductor layer receives light applied from a side opposite to a side of said substrate on which an original is conveyed onto the surface of an image-carrying original and reflected by the original, so that said semiconductor layer produces an electrical signal representing the read image, said image reading device comprising:
an electrically-conductive layer comprising said light-shielding layer; and
voltage application means for applying to said light-shielding layer a voltage of a level which is lower than levels of voltages applied to said pair of upper electrodes, said voltage application means applying to said light-shielding layer a voltage which is high enough to change said semiconductor layer into a depletion layer over an entire thickness of said semiconductor layer.

13. An image reading device having photosensor units each including a light-shielding layer formed on a light-transmitting substrate, an insulating layer formed on said light-shielding layer, a semiconductor layer disposed on said insulating layer, and a pair of upper electrodes provided on said semiconductor layer and spaced from each other, the space between said upper electrodes comprising a light-receiving window through which said semiconductor layer receives light applied from a side opposite to a side of said substrate on which an original is conveyed onto the surface of an image-carrying original and reflected by the original, so that said semiconductor layer produces an electrical signal representing the read image, said image reading device comprising:
an electrically conductive layer comprising said light-shielding layer; and
voltage application means adapted to apply to said light-shielding layer a bias voltage of a polarity determined in accordance with the polarity of the carriers carrying the photoelectric current generated in said semiconductor layer and of a level determined in accordance with the quantity of the charge of said carriers, said voltage application means being further adapted to apply, in the non-reading period of the reading operation, a voltage $V_a$ having the same polarity as said bias voltage and an absolute value smaller than that of said bias voltage, said voltage application means applying said voltage $V_a$ to said light-shielding layer for a predetermined period immediately before the commencement of the reading operation.

14. An image reading device having a plurality of photosensors arrayed on a substrate in a predetermined direction and each including an electrically conductive layer, an insulating layer formed on said conductive layer, a semiconductor layer disposed on said insulating layer, and a pair of main electrodes provided in contact with said semiconductor layer and spaced from each other, said photosensors being arranged linearly on said substrate in the direction of a width of the original, said image reading device comprising:
a bias voltage applicator for applying a bias voltage to said conductive layer, a level of said bias voltage being varied in the predetermined direction.

15. An image reading device having photosensor units each including a light-shielding layer formed on a light-transmitting substrate, an insulating layer formed on said light-shielding layer, a semiconductor layer disposed on said insulating layer, and a pair of upper electrodes provided on said semiconductor layer and spaced from each other, the space between said upper electrodes comprising a light-receiving window through which said semiconductor layer receives light applied from a side opposite to a said of said substrate on which an original is conveyed onto the surface of an image-carrying original and reflected by the original, so that said semiconductor layer produces an electrical signal representing the read image, the array of said photosensor units having a length corresponding to a width of an original carrying the image to be read, said image reading device comprising:
an electrically conductive layer comprising said light-shielding layer; and
voltage application means for applying to said light-shielding layer a voltage of a level which is lower than levels of voltages applied to said pair of upper electrodes.

16. An image reading device having a plurality of photosensors arrayed on a substrate in a predetermined direction and each including an electrically conductive layer, an insulating layer formed on said conductive layer, a semiconductor layer disposed on said insulating layer, and a pair of main electrodes provided in contact with said semiconductor layer and spaced away from each other, said photosensors being arranged linearly on said substrate in the direction of a width of the original, the array of said photosensor units being grouped into a plurality of blocks each having a predetermined number of photosensor units, said image reading device comprising:
a bias voltage applicator for applying a bias voltage to said conductive layer, a level of said bias voltage being varied in the predetermined direction, said bias voltage application means applying different levels of biasing voltage to different blocks of said photosensor units.

17. An image reading device having a plurality of photosensors arrayed on a substrate in a predetermined direction and each including an electrically conductive layer, an insulating layer formed on said conductive layer, a semiconductor layer disposed on said insulating layer, and a pair of main electrodes provided in contact with said semiconductor layer and spaced from each other, said substrate comprising a transparent material, said semiconductor layer receiving, through a window comprising a space between said pair of main electrodes, light which is applied from a side opposite to a side of said substrate on which an original is conveyed onto the original carrying the image to be read and reflected by said original, said image reading device comprising:
a bias voltage applicator for applying a bias voltage to said conductive layer, a level of said bias voltage being varied in the predetermined direction.

* * * * *

UNITED STATES PATENT AND TRADEMARK OFFICE
CERTIFICATE OF CORRECTION

PATENT NO. : 5,097,304
DATED : March 17, 1992
INVENTOR(S) : SATOSHI ITABASHI, ET AL.

It is certified that error appears in the above-identified patent and that said Letters Patent is hereby corrected as shown below:

On the title page, item

[56] References Cited
FOREIGN PATENT DOCUMENTS insert -- 53-147835  12/1978  Japan
                54-121017   9/1979  Japan
                55-25006    2/1980  Japan --

"56-112172  9/1981  Japan" should read --56-122174 9/1981 Japan--

[56] References Cited insert -- OTHER PUBLICATIONS
        Patent Abstracts of Japan, vol. 9, no. 270
        (E-353)[1993], October 26, 1985.
        JP-A-60 115 259 (Nippon Denshin Denwa Kosha),
        June 21, 1985--

COLUMN 1:

Line 19, "relatively" should read --relative--.
    Line 40, "direct on" should read --direction--.
    Line 62, "so" should read --such--; and "such" should read --so--.

COLUMN 2:

Line 5, ""a- -Si: H"," should read --"a-Si:H",--
    Line 29, "photo-electric" should read --photoelectric--.
    Line 66, "$^H$has" should read --H has--.

UNITED STATES PATENT AND TRADEMARK OFFICE
CERTIFICATE OF CORRECTION

PATENT NO. : 5,097,304
DATED : March 17, 1992
INVENTOR(S) : SATOSHI ITABASHI, ET AL.

It is certified that error appears in the above-identified patent and that said Letters Patent is hereby corrected as shown below:

COLUMN 3:

Line 54, "other, the" should read --other. The--.

COLUMN 5:

Line 10, "A-A" should read --line A-A--.
    Line 21, "electrode) 117" should read --electrode) and 117--.
    Line 33, "the" should be deleted.
    Line 34, "of" (1st occurrence) should read --of the--.
    Line 49, "2C" should read --3C--.

COLUMN 6:

Line 37, "an" should read --a--.
    Line 58, "gate" should read --a gate--.

COLUMN 7:

Line 19, "RY1" should read --SRY1)--.
    Line 30, "of" (2nd occurrence) should be deleted.
    Line 40, "transfer" should read --discharge--.

COLUMN 8:

Line 10, "SiNiH" should read --SiNH--.

UNITED STATES PATENT AND TRADEMARK OFFICE
CERTIFICATE OF CORRECTION

PATENT NO. : 5,097,304  Page 3 of 5
DATED : March 17, 1992
INVENTOR(S) : SATOSHI ITABASHI, ET AL.

It is certified that error appears in the above-identified patent and that said Letters Patent is hereby corrected as shown below:

COLUMN 9:

Line 32, "represents" should read --represented--.
Line 47, "photo-sensor" should read --photo-senor units--.
Line 51, "SY1," should read --$S_i$,--.
Line 52, "$CY_i$," should read --$C_i$,--.
Line 60, "STY1" should read --$S_i$

COLUMN 11:

Line 64, "layer 14" should read --layers 14--.

COLUMN 12:

Lines 15 and 16 should be deleted.
Line 17, "responding to the" should be deleted.
Line 34, "oppose to" should read --to oppose--.

COLUMN 13:

Line 24, "sensor a" should read --a sensor--
Line 53, "Fig." should read --Figs.--

COLUMN 14:

Line 20, "photo-sensor" should read --photo-sensor units--.
Line 28, "of" (2nd occurrence) should be deleted.
Line 37, "$SR_i$" should read --$SRY_i$--.

UNITED STATES PATENT AND TRADEMARK OFFICE
CERTIFICATE OF CORRECTION

PATENT NO. : 5,097,304          Page 4 of 5
DATED      : March 17, 1992
INVENTOR(S) : SATOSHI ITABASHI, ET AL.

It is certified that error appears in the above-identified patent and that said Letters Patent is hereby corrected as shown below:

COLUMN 15:

Line  5, "capacitor CX1" should read --capacitor CX2--.
Line 21, "was" should read --were--.
Line 34, "0f" should read --of--.
Line 65, "units SY1" should read --units $S_i$,--.
Line 66, "capacitors $CY_i$," should read --capacitors $C_i$,--.

COLUMN 16:

Line  1, "1728 of" should read --of 1728--.
Line 44, capacitor C1" should read --capacitor $C_1$--.
Line 45, "switch SR1." should read --switch $SR_1$.--.

UNITED STATES PATENT AND TRADEMARK OFFICE
CERTIFICATE OF CORRECTION

PATENT NO. : 5,097,304

DATED : March 17, 1992

INVENTOR(S) : SATOSHI ITABASHI, ET AL.

It is certified that error appears in the above-identified patent and that said Letters Patent is hereby corrected as shown below:

COLUMN 17:

Line 43, "aid" should read --said--.
    Line 59, "transmission" should read --transmitting--.

COLUMN 18:

Line 15, "$V_8$" should read --$V_a$--.

COLUMN 19:

Line 5, "alight shielding" should read --a light-shielding--.

COLUMN 20:

Line 16, "said" (1st occurrence) should read --side--.

Signed and Sealed this

Twenty-sixth Day of October, 1993

Attest:

BRUCE LEHMAN

*Attesting Officer*     *Commissioner of Patents and Trademarks*